US006174646B1

(12) United States Patent
Hirai et al.

(10) Patent No.: US 6,174,646 B1
(45) **Date of Patent: *Jan. 16, 2001**

(54) IMAGE FORMING METHOD

(75) Inventors: Katsura Hirai; Ryoji Hattori; Junko Honda, all of Hino (JP)

(73) Assignee: Konica Corporation (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/174,058

(22) Filed: Oct. 16, 1998

(30) Foreign Application Priority Data

Oct. 21, 1997 (JP) .................................................. 9-288496
Oct. 31, 1997 (JP) .................................................. 9-300540

(51) Int. Cl.[7] ...................................................... G03F 7/26
(52) U.S. Cl. ......................... 430/302; 430/325; 430/944; 430/270.1
(58) Field of Search ................................ 430/270.1, 302, 430/325, 330, 944, 399; 396/626, 604, 627

(56) References Cited

U.S. PATENT DOCUMENTS 4,237,611 12/1980 Sander et al. .
4,816,375 3/1989 Aoai .
5,002,857 * 3/1991 Toyama et al. ...................... 430/300
5,217,848 * 6/1993 Uehara et al. ....................... 430/309
5,340,699 8/1994 Haley et al. .
5,364,734 * 11/1994 Pawlowski et al. ................. 430/230
5,401,607 * 3/1995 Takiff et al. ........................ 430/255
5,576,143 * 11/1996 Aoai et al. ........................ 430/270.1
5,663,035 * 9/1997 Masuda et al. .................. 430/270.1
5,693,452 * 12/1997 Aoai et al. ........................ 430/270.1
5,811,224 * 9/1998 Seeley et al. ........................ 430/399
5,853,963 * 12/1998 Singh et al. ......................... 430/399
5,930,547 * 7/1999 Stein et al. ........................... 396/568
6,004,728 * 12/1999 Deroover et al. .................... 430/302
6,083,658 * 7/2000 Kunita et al. ..................... 430/270.1

FOREIGN PATENT DOCUMENTS 0884647 12/1998 (EP) .

* cited by examiner

*Primary Examiner*—Janet Baxter
*Assistant Examiner*—Barbara Gilliam
(74) *Attorney, Agent, or Firm*—Jordan B. Bierman; Bierman, Muserlian and Lucas

(57) ABSTRACT

Disclosed is an image forming method comprising the steps of imagewise heating or imagewise exposing to a laser with a wavelength of 700 to 1200 nm an image forming material; and continuously developing the exposed or heated material with a developer, while the developer is replenished with a developer replenisher, wherein the image forming material comprises a support and provided thereon, a radiation sensitive layer containing a dye having an absorption band in the wavelength region of from 700 nm to 1200 nm, an acid generating compound capable of generating an acid on irradiation of heat or actinic light, and an acid decomposable compound having a bond capable of being decomposed by an acid, the acid decomposable compound being decomposed by an acid to produce a diol compound containing an ethylene glycol component or a propylene glycol component.

21 Claims, 1 Drawing Sheet

IMAGE FORMING METHOD

FIELD OF THE INVENTION

The present invention relates to an image forming material comprising a radiation sensitive layer containing a radiation sensitive composition of so-called "positive working type" which is capable of being solubilized by heat or actinic light irradiation, or an image forming material comprising a radiation sensitive layer containing a radiation sensitive composition of so-called "negative working type" which is capable of being insolubilized by heat or actinic light irradiation, and particularly to an image forming technique comprising exposing the image forming material to infrared rays such as a semiconductor laser.

BACKGROUND OF THE INVENTION

A presensitized planographic printing plate is well known which comprises a positive working light sensitive composition capable of being solubilized by actinic light irradiation.

As a light sensitive material comprising a positive working light sensitive composition to be solubilized by actinic light irradiation, an image forming material comprising a light sensitive layer containing an acid generating compound and an acid decomposable compound is known. For example, a light sensitive composition containing an orthocarbonic acid, or a compound having a carbonic acid amide acetal group is disclosed in U.S. Pat. No. 3,779,779, a light sensitive composition containing a compound having an acetal in the main chain is disclosed in Japanese Patent O.P.I. Publication No. 53-133429, and a light sensitive composition containing a compound having a silylether group is disclosed in Japanese Patent O.P.I. Publication Nos. 60-37549 and 60-121446. These compositions have sensitivity in the ultraviolet range. In image forming materials comprising a light sensitive layer containing these compositions, the light sensitive layer is alkali solubilized by imagewise ultraviolet ray exposure to provide non-image portions at exposed portions and image portions at non-exposed portions.

In Japanese Patent Publication Nos. 52-7364 and 52-3216 is disclosed a negative working light sensitive material in which when the material is exposed to actinic light, photopolymerization or photo-crosslinking reaction occurs at exposed portions to form an image. Ultraviolet rays are used for an exposure source as in the positive working light sensitive material. In U.S. Pat. No. 5,340,699 is disclosed an image forming material comprising a light sensitive layer containing an acid generating compound, an acid crosslinking materal (a resol resin), a binder (a novolak resin) and an infrared absorber, wherein the material is exposed to infrared rays, and the exposed portions are insolubilized in an alkali.

Recently, improvements in processability have been required. In printing industries, a plate-making process comprising easily editing through software, so-called CTP (computer to plate process), has appeared before the footlights as an alternative of conventional editing processes requiring many hands. CTP is a process capable of recording digitally employing an inexpensive and compact infrared laser. This technique employs an image forming material comprising an infrared absorbent as an essential component which is capable of absorbing an infrared laser. The image forming material enables an image forming method comprising imagewise exposing to infrared semiconductor laser to form an image.

Ordinarily, these image forming materials are imagewise exposed, and then developed with a developer which is recirculated and is replenished with a developer replenisher. During development, components in the light sensitive layer, particularly acid decomposed components, are incorporated into the developer. In this process, however, there are problems in that the incorporation results in fluctuation of developability of the developer and in sludge occurrence (precipitates and/or floating matter) due to insufficient solubility of the components. Particularly, the sludge adheres to the image forming materials to be developed, resulting in stains. When the process described above is applied to manufacture of a printing plate, such stains produce a large number of paper wastes during printing, which incurs a great loss.

The above problems become more noticeable as the amount of image forming materials to be processed increases and the replenishing amount of the developer replenisher is reduced. Particularly when a developer containing a silicate is used as a developer, the problems are most prominent, and resolution thereof is required for practical use.

CTP has a problem in that satisfactory sensitivity is not obtained as compared to conventional UV ray exposure. Further, the above described light sensitive materials have poor storage stability and poor safelight safety property. For example, in the conventional positive working light sensitive material, sensitivity and dot reproduction are fluctuated, and in the conventional negative working light sensitive material, stain is likely to occur. With regards to safelight safety property, white light resistance is not sufficient. In the positive working light sensitive material, the thickness of the radiation sensitive layer is decreased on development under white light lamp, resulting in lowering of printing durability, and in the negative working light sensitive material, stain is likely to occur at non-image portions. Resolution of the above problems is required.

SUMMARY OF THE INVENTION

The present invention has been made in view of the above.

An object of the invention is to provide an image forming method of forming an image of high resolving power using a radiation sensitive composition with high sensitivity. Another object of the invention is to provide an image forming method of minimizing sludge occurrence in a developer, and stabilizing developability of a developer, and an image forming method capable of continuously processing a large amount of image forming materials even under reduced replenishing amount of a developer replenisher resulting in reduced amount of waste (including a developer waste). Further another object of the invention is to provide an image forming method capable of forming an image of high resolving power with high sensitivity in a process comprising imagewise infrared laser exposure which is applied to CTP.

Still further another object of the invention is to provide a positive or negative working light sensitive material having excellent sensitivity, excellent storage stability, and easy handling property in use (which makes it possible to handle under white light).

DETAILED DESCRIPTION OF THE INVENTION

Figure 1:
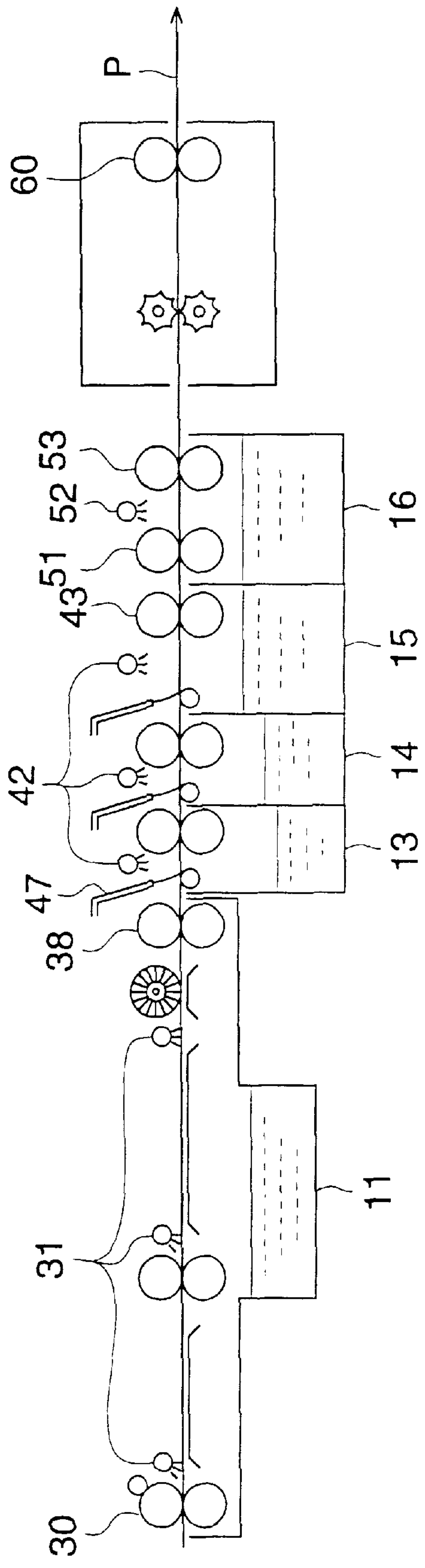
FIG. 1 is a schematic view of an automatic processor.

The above object of the invention can be attained by the followings:

(1) An image forming material comprising a support and provided thereon, a radiation sensitive layer containing a dye sensitive to light having a wavelength region of from 700 nm to 1200 nm, a compound having a bond capable of being decomposed by an acid, and an acid generating compound which does not have an absorption band in the wavelength region of 400 nm or more.

(2) An image forming material comprising a support and provided thereon, a radiation sensitive layer containing a dye sensitive to light having a wavelength region of from 700 nm to 1200 nm, a compound capable of being insolubilized in an alkali by an acid, and an acid generating compound which does not have an absorption band in the wavelength region of 400 nm or more.

The preferable includes the above image forming material wherein the acid generating compound is selected from an organic halogen containing compound or a diphenyl iodonium salt, the above image forming material wherein the organic halogen containing compound is an s-triazine compound, and the above image forming material wherein the radiation sensitive layer contains a resin which is insoluble in water and is soluble in an alkali.

The present inventors have made an extensive study on problems that sensitivity is not satisfactory in CTP, storage stability is poor, and safelight safety property is poor. As a result, the inventors have found that an important factor resides in an acid generating compound, and improvement in safelight safety property (handling under room light) results in excellent sensitivity and excellent storage stability, and have completed the present invention.

The above object of the invention can be attained by the followings:

an image forming method comprising the steps of imagewise exposing or heating an image forming material; and continuously processing the exposed or heated material employing a developer while replenished with a developer replenisher, wherein the image forming material comprises a support and provided thereon, a radiation sensitive layer containing (1) a compound capable of generating an acid on irradiation of heat or actinic light, and (2) an acid decomposable compound, the acid decomposable compound being decomposed by an acid to produce a diol compound containing an ethylene glycol component or a propylene glycol component.

The preferable image forming method includes the followings:

a. the image forming method above, wherein the radiation sensitive layer further contains a resin which is insoluble in water and soluble in an alkali.

b. the image forming method above, wherein the acid decomposable compound is an acetal or a silyl ether.

c. the image forming method above, wherein the acid decomposable compound is decomposed by an acid to produce an aldehydes, a ketone or a silyl compound each having a solubility in 25° C. water of 1 to 10 g/liter.

d. the image forming method above, wherein the radiation sensitive layer further contains a dye absorbing light having a wavelength of 400 nm or more.

e. the image forming method above, wherein the dye is a dye absorbing light having a wavelength of 700 to 1200 nm.

f. the image forming method above, wherein the imagewise exposing is carried out employing a laser with a wavelength of 700 to 1200 nm.

g. the image forming method above, wherein the developer contains a silicate.

h. the image forming method above, wherein the developer replenisher is replenished in the developer in an amount of 5 to 100 ml per $m^2$ of image forming material to be processed.

i. the image forming method above, wherein the developer replenisher is replenished in the developer in an amount of 5 to 50 ml per $m^2$ of image forming material to be processed.

j. the image forming method above, wherein the developer replenisher is replenished in the developer in an amount of 5 to 25 ml per $m^2$ of image forming material to be processed.

The present inventors have made an extensive study on problems occurring when a large amount of image forming materials are continuously processed while a developer replenisher is replenished in a developer. As a result, the inventors have found that an image forming method, comprising the step of processing an image forming material comprising an acid decomposable compound capable of producing a decomposed compound which is soluble in a developer and has no adverse affect on developability, provides an image of high resolving power with high sensitivity, minimizes sludge occurrence in the developer, stabilizes developability of the developer, increases the amount of image forming materials to be processed even under reduced replenishing amount of the developer replenisher, resulting in reduced amount of waste, and have completed the present invention.

According to the method of the invention, an image of high resolving power is obtained with high sensitivity, also in continuously processing a large amount of image forming materials after infrared laser exposure which is applied to CTP, and even in continuously processing the image forming materials under reduced replenishment of a developer replenisher which results in reduced amount of waste.

The present invention will be detailed below.

(1) Radiation Sensitive Composition (Acid Generating Compound)

An acid generating compound used in the invention does not have an absorption band in the wavelength region of 400 nm or more, and generates an acid on irradiation of heat or actinic light. The acid generating compound includes various conventional compounds and mixtures. For example, a salt of diazonium, phosphonium, sulfonium or iodonium ion with $BF_4^-$, $PF_6^-$, $SbF_6^-$, $SiF_6^{2-}$ or $ClO_4^-$, an alkyl onium salt disclosed in Japanese Patent O.P.I. Publication No. 4-42158, an organic halogen containing compound, o-quinonediazide sulfonylchloride or a mixture of an organic metal and an organic halogen containing compound is a compound capable of generating or releasing an acid on irradiation of heat or actinic light, and can be used as the acid generating compound in the invention. The organic halogen containing compound known as an photoinitiator capable of forming a free radical forms a hydrogen halide and can be used as the acid generating compound in the invention, unless it has an absorption band in the wavelength region of 400 nm or more.

The acid generating compound which does not have an absorption band in the wavelength region of 400 nm or more, herein referred to, implies an acid generating compound having 80% or more, preferably 100% in the wavelength region of less than 400 nm, based on the total area of absorption spectra of the compound, the absorption spectra having absorbance in the ordinates and wavelength in the abscissas.

The examples of the organic halogen containing compound capable of forming a hydrogen halide include those disclosed in U.S. Pat. Nos. 3,515,552, 3,536,489 and 3,779, 778 and West German Patent No. 2,243,621, and compounds generating an acid by photodegradation disclosed in West German Patent No. 2,610,842. The examples of the acid generating compounds include o-naphthoquinone diazide-4-sulfonylhalogenides disclosed in Japanese Patent O.P.I. Publication No. 50-36209, acid generating compounds such as compounds generating poly acids on ultraviolet light irradiation including compounds having two oxysulfonyl groups or two oxycarbonyl groups disclosed in Japanese Patent O.P.I. Publication No. 7-134410, acid generating compounds such as halogenated aryl compounds including tetrakis-1,2,4,5-(polyhalomethyl) benzene and tris (polyhalomethyl) benzene disclosed in Japanese Patent O.P.I. Publication No. 4-19666, a polymeric sulfonium salt containing a silyl ether group, or a halogenated alkyl compound disclosed in Japanese Patent O.P.I. Publication No. 6-342209, oxime sulfonate compounds disclosed in Japanese Patent O.P.I. Publication Nos. 9-96900 and 6-67433, halogenated sulfolane compounds disclosed in Japanese Patent O.P.I. Publication No. 4-338757, and sulfonic acid esters of N-hydroxyimide compounds, diazo compounds and diazo resins disclosed in Japanese Patent O.P.I. Publication Nos. 6-236024, 6-214391, 6-214392 and 7-244378.

The examples of the acid generating compound used in the invention are listed below.

S-1

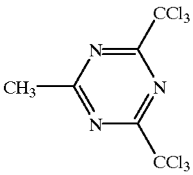

S-2

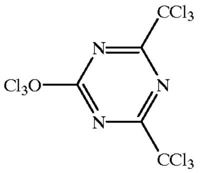

S-3

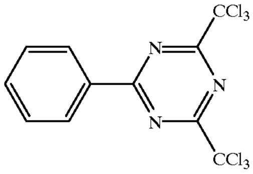

S-4

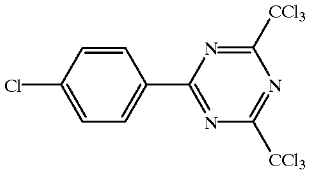

S-5

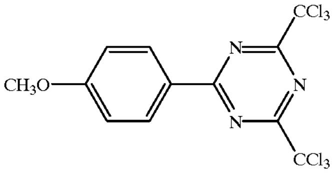

-continued

S-6

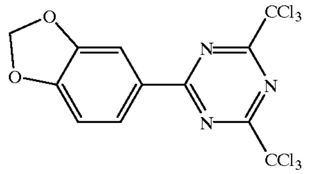

S-7

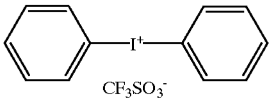

S-8

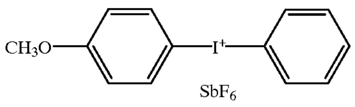

S-9

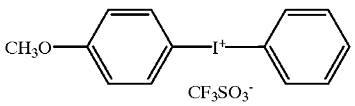

S-10

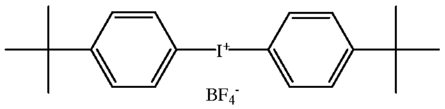

S-11

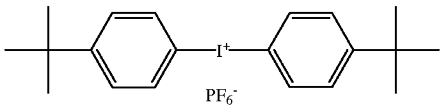

S-12

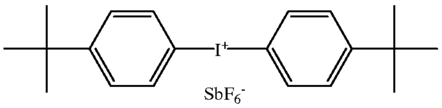

S-13

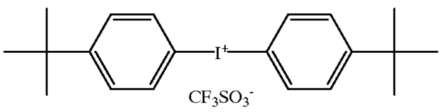

S-14

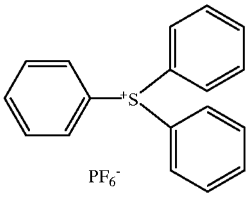

S-15

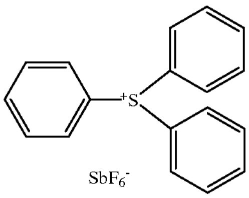

-continued
S-16
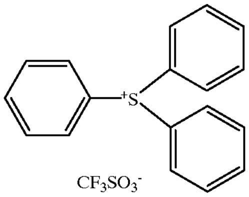
S-17
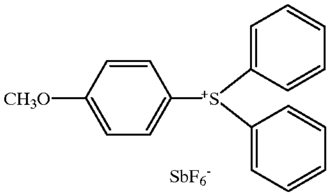
S-18
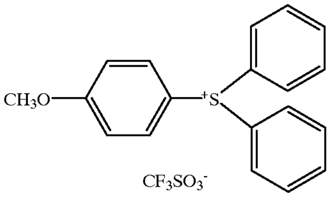
S-19
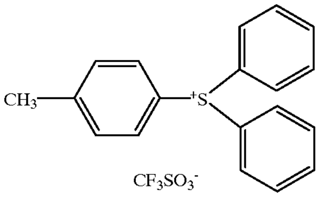
S-20
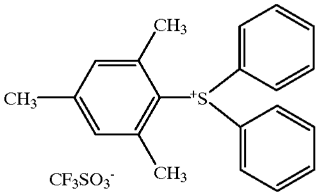
S-21
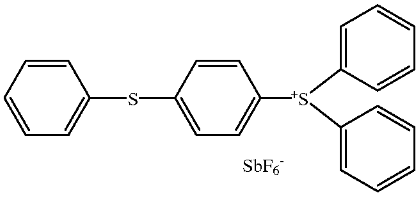
S-22
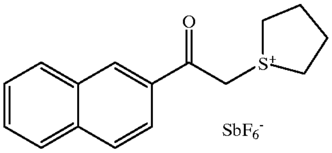
-continued
S-23
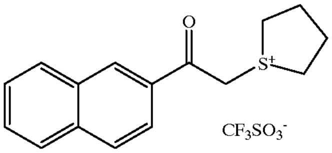
S-24
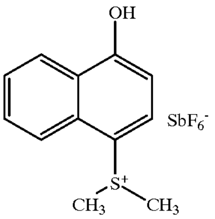
S-25
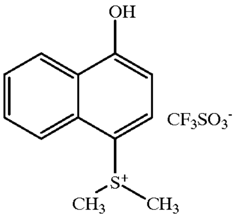
S-26
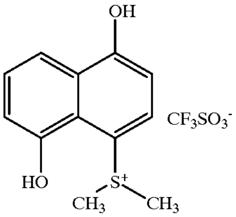
S-27
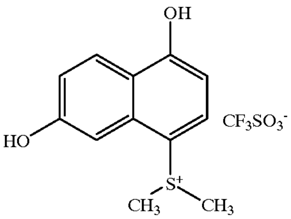
S-28
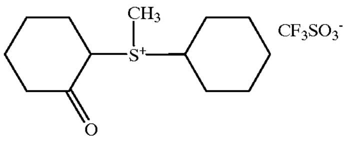
S-29
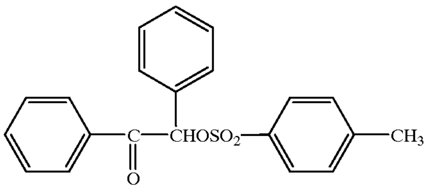

-continued
S-30
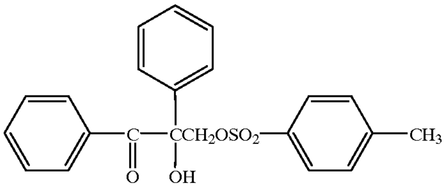
S-31
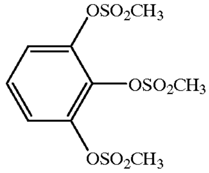
S-32
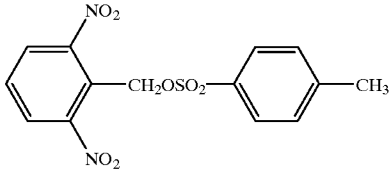
S-33
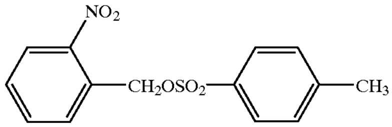
S-33
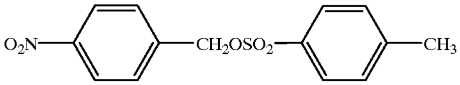
S-34
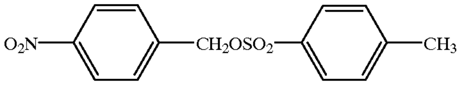
S-35
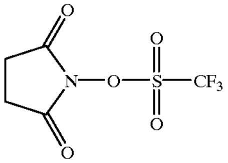
S-36
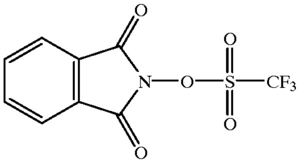
S-37
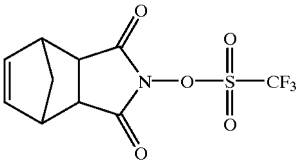
-continued
S-38
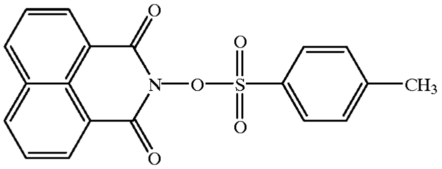
S-39
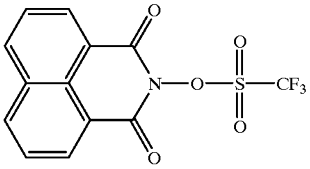
S-40
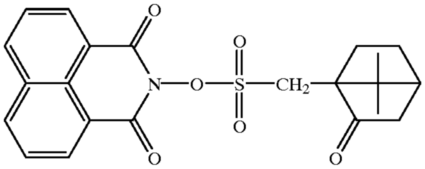
S-41
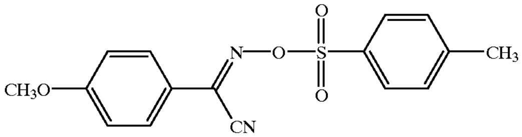
S-42
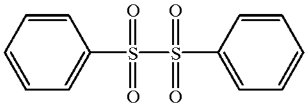
S-43
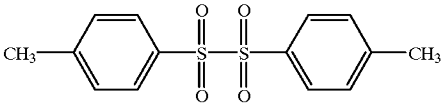
S-44
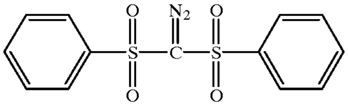
S-45
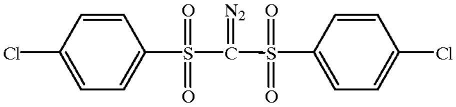
S-46
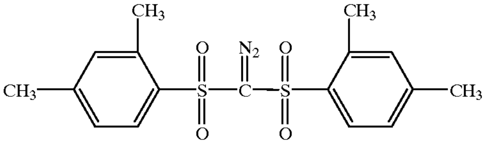
S-47
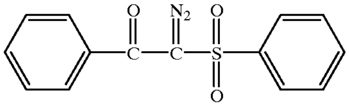

-continued

S-48

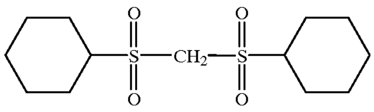

The acid generating compound in the invention is preferably an organic halogen containing compound or a diphenyl iodonium salt, in view of sensitivity and storage stability in an image forming process comprising infrared ray exposure. The organic halogen containing compound is preferably a halogenated alkyl-containing triazine. The absorption maximum λ max of the acid generating compound is preferably 200 to 360 nm, and a molar extinction coefficient ε at the λ max is preferably 10,000 or more, and more preferably 20,000 or more.

As the s-triazine acid generating compounds, compounds disclosed in Japanese Patent O.P.I. Publication Nos. 4-44737, 9-90633, and 4-226454 can be also used.

Another organic halogen containing compound includes a halogenated alkyl-containing triazine or a halogenated alkyl-containing oxadiazole. The examples of the halogenated alkyl-containing oxadiazoles include a 2-halomethyl-1,3,4-oxadiazole compound disclosed in Japanese Patent O.P.I. Publication Nos. 54-74728, 55-24113, 55-77742/1980, 60-3626 and 60-138539, and oxadiazole compounds disclosed in Japanese Patent O.P.I. Publication No. 4-46344. The preferable examples of the 2-halomethyl-1,3,4-oxadiazole compound are listed below. However, 2-halomethyl-1,3,4-oxadiazole acid generating compound is not preferable as an acid generating compound in view of safelight safety property.

A

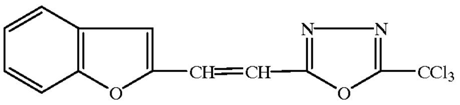

B

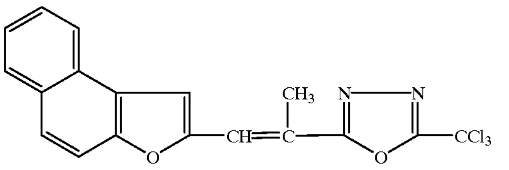

C

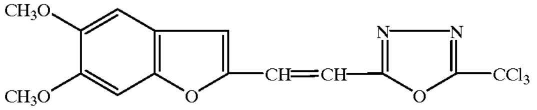

The acid generating compound used in the invention is preferably the following compound 1, 2 or 3: 1. a compound having an alkali soluble portion, 2. a bromomethylaryl ketone derivative, and 3. an aromatic compound having a trichloroacetylamino group.

The compound having an alkali soluble portion includes an ester (1) of a compound having two or more hydroxy groups with an alkanesulfonic acid, an ester (2) of a compound having two or more phenolic hydroxy groups with an alkanesulfonic acid, and an ester (3) of an anthracene derivative having two or more hydroxy groups with a sulfonic acid.

The ester (1) of a compound having two or more hydroxy groups with an alkanesulfonic acid will be explained below.

The ester (1) includes an ester of a compound having alcoholic hydroxy groups such as ethylene glycol, propylene glycol, glycerin or 1,2,4-butane triol with an alkanesulfonic acid. The alkyl group in the alkanesulfonic acid is preferably represented by CnH2n+1 (n is a natural number), and n is preferably 1 to 4. The ester (1), in which all or a part of the hydrogen of the alkyl group are replaced with a halogen group having high electronegativity such as fluorine or chlorine, is also useful. In the ester (1), all hydroxy groups of the compound having two or more hydroxy groups need not be esterified, and a part of the hydroxy groups may be free, whereby alkali solubility can be controlled.

The ester (2) of a compound having two or more phenolic hydroxy groups with an alkanesulfonic acid will be explained below. The ester (2) includes an ester of a compound having phenolic hydroxy groups such as catechol, resorcin, hydroquinone, pyrrogallol, oxyhydroquinone, phloroglucin, trihydroxybenzophenone, tetrahydroxybenzophenone or gallic acid ester with an alkanesulfonic acid. The alkyl group in the alkanesulfonic acid is the same as denoted above in the ester (1). In the ester (2), all phenolic hydroxy groups of the compound having two or more phenolic hydroxy groups need not be esterified, and a part of the phenolic hydroxy groups may be free, whereby alkali solubility can be controlled.

The ester (3) of an anthracene derivative having two or more hydroxy groups with a sulfonic acid will be explained below. The ester (3) includes an ester of an anthracene derivative such as dihydroxyanthracene, trihydroxyanthracene or tetrahydroxyanthracene with a sulfonic acid. The sulfonic acid includes an alkanesulfonic acid, an arylsulfonic acid and 1,2-naphthoquinonediazide sulfonic acid. The alkyl group in the alkanesulfonic acid is the same as denoted above in the ester (1). In the ester (3), all hydroxy groups of the compound having two or more hydroxy groups need not be esterified, and a part of the hydroxy groups may be free, whereby alkali solubility can be controlled.

The bromomethylaryl ketone derivative is preferably a bromomethylaryl ketone or a dibromomethylaryl ketone. The examples thereof include 2-bromoacetylnaphthalene, 2-bromoacetyl-6,7-dimethoxynaphthalene, 2-dibromoacetyl-6,7-dimethoxynaphthalene, 1-hydroxy-4-bromo-2-bromoacetyl-naphthalene, 1-hydroxy-4-bromo-2-dibromoacetyl-naphthalene, 2-hydroxy-1-bromoacetylnaphthalene, 1,4-bis(bromoacetyl)benzene, 4,4'-bis(bromoacetyl)biphenyl, 1,3,5-tris(bromoacetyl) benzene, and 1,3,5-tris(dibromoacetyl)benzene. These can be used singly or as a mixture of two or more thereof.

The aromatic compound having a trichloroacetylamino group is preferably a compound represented by the following formula:

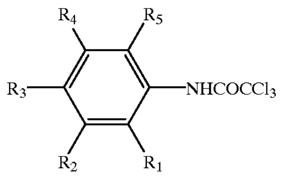

wherein $R_1$ through $R_5$ independently represent a hydrogen atom, an alkyl group having not more than 4 carbon atoms, an alkoxy group having not more than 4 carbon atoms, a halogen atom, a phenylamino group, a phenoxy group, a benzyl group, a benzoyl group, an acetyl group or a trichloroacetylamino group, and $R_1$ through $R_5$ may be the same or different from each other. The examples thereof include 4-phenoxytrichloroacetoanilide, 4-methoxytrichloroacetoanilide, 2,3-dimethoxytrichloroacetoanilide, 4-methoxy-2-chlorotrichloroacetoanilide, 3-acetyltrichloroacetoanilide, 4-phenyltrichloroacetoanilide, 2,3,4-trifluorotrichloroacetoanilide, 2,4,5-trimethyltrichloroacetoanilide, 2,4,6-tribromotrichloroacetoanilide, 2,4,6-trimethyltrichloroacetoanilide, 2,4-dichlorotrichloroacetoanilide, 2,4-dimethoxytrichloroacetoanilide, 2,5-dichlorotrichloroacetoanilide, 2,5-dimethoxytrichloroacetoanilide, 2,6-dimethyltrichloroacetoanilide, 2-ethyltrichloroacetoanilide, 2-fluorotrichloroacetoanilide, 2-methyltrichloroacetoanilide, 2-methyl-6-ethyltrichloroacetoanilide, 2-phenoxytrichloroacetoanilide, 2-propyltrichloroacetoanilide, 3,4-dichlorotrichloroacetoanilide, 3,4-dimethoxytrichloroacetoanilide, 3,4-dimethyltrichloroacetoanilide, 4-butyltrichloroacetoanilide, 4-ethyltrichloroacetoanilide, 4-fluorotrichloroacetoanilide, 4-iodotrichloroacetoanilide, 4-propyltrichloroacetoanilide, 2,3,4,5,6-pentafluorotrichloroacetoanilide, 4-propoxytrichloroacetoanilide, and 4-acetyltrichloroacetoanilide. These are suitable acid generating compounds in view of heat stability.

The acid generating compounds in the invention can be used alone or as a mixture of two or more thereof. The content of the acid generating compound in the radiation sensitive layer is preferably 0.1 to 20% by weight, and more preferably 0.2 to 10% by weight based on the total weight of the radiation sensitive layer, although the content broadly varies depending on its chemical properties, kinds of radiation sensitive layer composition used or physical properties of the composition.

(Acid Decomposable Compound)

The acid decomposable compound in the invention includes a compound having a C—O—C bond disclosed in Japanese Patent O.P.I. Publication Nos. 48-89003, 51-120714, 53-133429, 55-12995, 55-126236 and 56-17345, a compound having an Si—O—C bond disclosed in Japanese Patent O.P.I. Publication Nos. 60-37549 and 60-121446, another acid decomposable compound disclosed in Japanese Patent O.P.I. Publication Nos. 60-3625 and 60-10247, a compound having an Si—N bond disclosed in Japanese Patent O.P.I. Publication No. 62-22246, a carbonic acid ester disclosed in Japanese Patent O.P.I. Publication No. 62-251743, an orthotitanic acid ester disclosed in Japanese Patent O.P.I. Publication No. 62-280841, an orthosilicic acid ester disclosed in Japanese Patent O.P.I. Publication No. 62-280842, an acetal or ketal disclosed in Japanese Patent O.P.I. Publication No. 63-10153, a compound having a C—S bond disclosed in Japanese Patent O.P.I. Publication No. 62-244038, and a compound having a —O—C(═O)— bond disclosed in Japanese Patent O.P.I. Publication No. 63-231442. Of these compounds, acetals or silyl ethers are preferable.

The acid decomposable compound used in the invention is a compound capable of producing a diol compound containing an ethylene glycol component or a propylene glycol component after decomposed by an acid. The diol compound herein referred to implies a diol compound containing an ethyleneoxy group or propyleneoxy group in its molecule. The example of the diol compound is preferably a compound containing a group represented by a general formula, $-(CH_2CH_2O)n-$ or $-(CH_2CH_2(CH_3)O)m-$, in which n and m independently represent a natural number, and n and m are preferably from 1 to 5. The diol compound containing a group represented by a general formula, $-(CH_2CH_2O)n-(CH_2CH_2(CH_3)O)m-$, is also preferable. The example of the diol compound includes ethylene glycol, diethylene glycol, triethylene glycol, tetraethylene glycol, pentaethylene glycol, polyethylene glycol, propylene glycol, dipropylene glycol, tripropylene glycol, tetrapropylene glycol, pentapropylene glycol, polypropylene glycol, and a polyethylene glycol-polypropylene glycol copolymer.

Of these diol compounds, ethylene glycol or diethylene glycol is more preferable in view of sensitivity and development stability. In a process of forming an image using an infrared light and a radiation sensitive material comprising an infrared absorbent, ethylene glycol or diethylene glycol is especially preferable in view of sensitivity and development stability. Acetals or silyl ethers containing the diol component are especially preferable, and the example thereof is an acid decomposable compound represented by the following formula (1):

formula (1)

$$R_1-(XR_2R_3-O-R_4)_n-(XR_5R_6-O-R_7-O)_m-R_8$$

wherein n represents an integer of 1 or more; m represents an integer of 0, 1 or more; X represents a carbon atom or a silicon atom; $R_4$ represents an ethyleneoxy group or a propyleneoxy group, which corresponds to a diol component containing an ethylene glycol component or a propylene glycol component; $R_7$ represents an alkylene group; $R_2$ and $R_5$ independently represent a hydrogen atom, an alkyl group or an aryl group; $R_3$ and $R_6$ independently represent an alkyl group or an aryl group, provided that $R_2$ and $R_3$, and $R_5$ and $R_6$ both may combine with each other to form a ring; $R_1$ represents a hydrogen atom, an alkyl group, an aryl group, an alkoxy group, an alkyleneoxy group or a halogen atom; and $R_8$ represents a hydrogen atom, $-XR_2R_3R_1$ or $-XR_5R_6R_1$.

The acetal compound in the invention is preferably synthesized by polycondensation of acetals or ketals with the diol compound in view of good yield. Aldehydes for preparation of the acetals include acetoaldehyde, chloral, ethoxyacetoaldehyde, benzyloxyacetoaldehyde, phenylacetoaldehyde, diphenylacetoaldehyde, phenoxyacetoaldehyde, propionaldehyde, isobutoxypivalic aldehyde, benzyloxypivalic aldehyde, 3-ethoxypropanal, 3-cyanopropanal, n-butanal, isobutanal, 3-chloro-butanal, 3-methoxy-butanal, 2,2-dimethyl-4-cyano-butanal, 2 or 3-ethylbutanal, n-pentanal, 2 or 3-methylpentanal, 2-bromo-3-methylpentanal, 2-hexanal, cyclopentanecarbaldehyde, n-heptanal, cyclohexanecarbaldehyde, 1,2,3,6-tetrahydrobenzaldehyde, 3-ethylpentanal, 3- or 4-methylhexanal, n-octanal, 2- or 4-ethylhexanal, 3,5,5-trimethylhexanal, 4-methylheptanal, 3-ethyl-n-heptanal, decanal, dodecanal, crotonaldehyde, benzaldehyde, 2-, 3- or 4-bromobenzaldehyde, 2,4-, or 3,4-dichlorobenzaldehyde, 4-methoxybenzaldehyde, 2,3- or 2,4-dimethoxybenzaldehyde, 2-, 3- or 4-fluorobenzaldehyde, 2-, 3- or 4-methylbenzaldehyde, 4-isopropylbenzaldehyde, 3- or 4-tetrafluoroethoxybenzaldehyde, 1-, or 2-naphthoaldehyde, furfural, thiophene-2-aldehyde, terephthalaldehyde, piperonal, 2-pyridinecarbaldehyde, p-hydroxy-benzaldehyde, 3,4-dihydroxy-benzaldehyde, 5-methyl-furaldehyde and vanillin. Ketones for preparation of the ketals include phenylacetone, 1,3-diphenylacetone, 2,2-diphenylacetone, chloro, or bromoacetone, benzylacetone, methyl ethyl ketone, benzyl propyl ketone, ethylbenzyl ketone, isobutyl ketone, 5-methyl-hexane-2-one, 2-methyl-pentane-2-one, 2-methyl-pentane-3-one, hexane-2-one, pentane-3-one, 2-methyl-butane-3-one, 2,2-dimethyl-butane-3-one, 5-methyl-heptane-3-one, octane-2-one, octane-3-one, nonane-2-one, nonane-3-one, nonane-5-one, heptane-2-one, heptane-3-one, heptane-4-one, undecane-2-one, undecane-4-one, undecane-5-one, undecane-6-one, dodecane-2-one, dodecane-3-one, triecane-2-one, tridecane-3-one, triecane-7-one, dinonyl ketone, dioctyl ketone, 2-methyl-octane-3-one, cyclopropyl methyl ketone, decane-2-one, decane-3-one, decane-4-one, methyl-α-naphthyl ketone, didecyl ketone, diheptyl ketone, dihexyl ketone, acetophenone, 4-methoxy-acetophenone, 4-chloro-acetophenone, 2,4-dimethyl-acetophenone, 2-, 3- or 4-fluoroacetophenone, 2-, 3- or 4-methylacetophenone, 2-, 3- or 4-methoxyacetophenone, propiophenone, 4-methoxy-propiophenone, butyrophenone, valerophenone, benzophenone, 3,4-dihydroxybenzophenone, 2,5-dimethoxybenzophenone, 3,4-dimethoxybenzophenone, 3,4-dimethylbenzophenone, cyclohexanone, 2-phenyl-cyclohexanone, 2-, 3- or 4-methyl-cyclohexanone, 4-t-butyl-cyclohexanone, 2,6-dimethyl-cyclohexanone, 2-chloro-cyclohexanone, cyclopentanone, cycloheptanone, cyclooctanone, cyclononanone, 2-cyclohexene-1-one, cyclohexylpropanone, flavanone, cyclohexane-1,4-dione, cyclohexane-1,3-dione, tropone, and isophorone.

The preferable are aldehydes or ketones which have a solubility in 25° C. water of 1 to 100 g/liter. Solubility of less than 1 g/liter is likely to produce sludge while continuously processing, and solubility exceeding 100 g/liter is likely to lower resolving power of formed images. The example thereof includes benzaldehyde, 4-hydroxybenzaldehyde, 3, 4-dihydroxybenzaldehyde, 2-pyridinecarbaldehyde, piperonal, phthalaldehyde, terephthalaldehyde, 5-methyl-2-phthalaldehyde, phenoxyacetoaldehyde, phenylacetoaldehyde, cyclohexanecarbaldehyde, vanillin, cyclohexanone, cyclohexene-1-one, isobutylaldehyde, and pentanal. Of these, cyclohexanone is more preferable in view of processing stability.

The silyl ether compound in the invention is synthesized by polycondensation of a silyl compound with the above diol compound. In the invention, a silyl compound, which forms on decomposition of the silylether compound by an acid, has preferably a solubility in 25° C. water of 1 to 100 g/liter.

The example of the silyl compound includes dichlorodimethyl silane, dichlorodiethyl silane, methylphenyldichloro silane, diphenyldichloro silane, and methylbenzyldichloro silane.

The above described acetal compounds or silylether compounds can be synthesized also by copolycondensation using the above diol compounds and alcohol components other than the diol compounds. The alcohol components include substituted or unsubstituted monoalkyl alcohols such as methanol, ethanol, n-propanol, isopropanol, butanol, pentanol, hexanol, cyclohexanol, and benzyl alcohol; glycol ethers such as ethylene glycol monomethylether, ethylene glycol monoethylether, ethylene glycol monomphenylether, diethylene glycol monomethylether, diethylene glycol monoethylether, diethylene glycol monomphenylether, and substituted or unsubstituted polyethylene glycol alkylethers or polyethylene glycol phenylethers. The dihydric alcohols include pentane-1,5-diol, n-hexane-1,6-diol, 2-ethylhexane-1,6-diol, 2,3-dimethylhexane-1,6-diol, heptane-1,7-diol, cyclohexane-1,4-diol, nonane-1,7-diol, nonane-1,9-diol, 3,6-dimethyl-nonane-1,9-diol, decane-1,10-diol, dodecane-1,12-diol, 1,4-bis(hydroxymethyl)-cyclohexane, 2-ethyl-1,4-bis(hydroxymethyl)-cyclohexane, 2-methyl-cyclohexane-1,4-diethanol, 2-methyl-cyclohexane-1,4-dipropanol, thiodipropylene glycol, 3-methyl-pentane-1,5-diol, dibutylene glycol, 4,8-bis(hydroxymethyl)-tricyclodecane, 2-butene-1,4-diol, p-xylylene glycol, 2,5-dimethyl-hexane-3-yne-2,5-diol, bis(2-hydroxyethyl)-sulfide, and 2,2,4,4-tetramethylcyclobutane-1,3-diol. In this embodiment, the content ratio (by mole) of the diol compound containing an ethylene glycol component or a propylene glycol component to the alcohol component in the acetal compounds or silyl ether compounds is preferably from 70:30 to 100:0, and more preferably from 85:15 to 100:0.

The acid decomposable compound content of the radiation sensitive layer in the invention is preferably 0.5 to 50 weight %, and more preferably 5 to 25 weight %.

The acid decomposable compound in the invention has a weight average molecular weight of preferably 500 to 10000, and more preferably 1000 to 3000 in terms of standard polystyrene measured according to gel permeation chromatography (GPC).

Synthetic examples of the acid decomposable compound used in the invention will be described below.

(Synthesis of Acid Decomposable Compound A-1)

A mixture of 1.0 mol of 1,1-dimethoxycyclohexane, 1.0 mol of ethylene glycol, 0.003 mol of p-toluene sulfonic acid hydrate and 500 ml of toluene was reacted at 100° C. for 1 hour with stirring, gradually elevated to 150° C. and reacted at 150° C. for additional 4 hours while methanol produced during reaction was removed. The reaction mixture solution was cooled, washed with water, an aqueous 1% sodium hydroxide solution, and an aqueous 1 N sodium hydroxide solution in that order. The resulting mixture was further washed with an aqueous saturated sodium chloride solution, and dried over anhydrous potassium carbonate. The solvent (toluene) of the resulting solution was removed by evaporation under reduced pressure to obtain a residue. The residue was further dried 80° C. for 10 hours under vacuum to obtain a wax compound. Thus, an acid decomposable compound A-1 was obtained. The weight average molecular weight Mw of compound A-1 was 1200 in terms of standard polystyrene measured according to GPC.

(Synthesis of Acid Decomposable Compound A-2)

An acid decomposable compound A-2 in a waxy form was prepared in the same manner as in acid decomposable compound A-1, except that diethylene glycol was used instead of ethylene glycol. The weight average molecular weight Mw of compound A-2 was 2000 in terms of standard polystyrene measured according to GPC.

(Synthesis of Acid Decomposable Compound A-3)

An acid decomposable compound A-3 in a waxy form was prepared in the same manner as in acid decomposable compound A-1, except that triethylene glycol was used instead of ethylene glycol. The weight average molecular weight Mw of compound A-3 was 1500 in terms of standard polystyrene measured according to GPC.

(Synthesis of Acid Decomposable Compound A-4)

An acid decomposable compound A-4 in a waxy form was prepared in the same manner as in acid decomposable compound A-1, except that tetraethylene glycol was used instead of ethylene glycol. The weight average molecular weight Mw of compound A-4 was 1500 in terms of standard polystyrene measured according to GPC.

(Synthesis of Acid Decomposable Compound A-5)

An acid decomposable compound A-5 in a waxy form was prepared in the same manner as in acid decomposable compound A-1, except that dipropylene glycol was used instead of ethylene glycol. The weight average molecular weight Mw of compound A-5 was 2000 in terms of standard polystyrene measured according to GPC.

(Synthesis of Acid Decomposable Compound A-6)

An acid decomposable compound A-6 in a waxy form was prepared in the same manner as in acid decomposable compound A-2, except that benzaldehyde dimethylacetal was used instead of 1,1-dimethoxycyclohexane. The weight average molecular weight Mw of compound A-6 was 2000 in terms of standard polystyrene measured according to GPC.

(Synthesis of Acid Decomposable Compound A-7)

An acid decomposable compound A-7 in a waxy form was prepared in the same manner as in acid decomposable compound A-2, except that furaldehyde dimethylacetal was used instead of 1,1-dimethoxycyclohexane. The weight average molecular weight Mw of compound A-7 was 2000 in terms of standard polystyrene measured according to GPC.

(Synthesis of Acid Decomposable Compound A-8)

An acid decomposable compound A-8 in a waxy form was prepared in the same manner as in acid decomposable compound A-2, except that 1,1-dimethoxycyclopentane was used instead of 1,1-dimethoxycyclohexane. The weight average molecular weight Mw of compound A-8 was 1800 in terms of standard polystyrene measured according to GPC.

(Synthesis of Acid Decomposable Compound A-9)

An acid decomposable compound A-9 in a viscous oily form was prepared in the same manner as in acid decomposable compound A-2, except that dimetyl ketal of methyl ethyl ketone was used instead of 1,1-dimethoxycyclohexane. The weight average molecular weight Mw of compound A-9 was 1200 in terms of standard polystyrene measured according to GPC.

(Synthesis of Acid Decomposable Compound A-10)

An acid decomposable compound A-10 in a waxy form was prepared in the same manner as in acid decomposable compound A-1, except that 0.6 mol of diethylene glycol and 0.4 mol of xylylene glycol were used instead of 1 mol of ethylene glycol. The weight average molecular weight Mw of compound A-10 was 2000 in terms of standard polystyrene measured according to GPC.

(Synthesis of Acid Decomposable Compound A-11)

An acid decomposable compound A-11in a waxy form was prepared in the same manner as in acid decomposable compound A-10, except that diethylene glycol was changed to 0.75 mol and xylylene glycol was changed to 0.25 mol. The weight average molecular weight Mw of compound A-11 was 2000 in terms of standard polystyrene measured according to GPC.

(Synthesis of Acid Decomposable Compound A-12)

An acid decomposable compound A-12 in a waxy form was prepared in the same manner as in acid decomposable compound A-10, except that diethylene glycol was changed to 0.9 mol and xylylene glycol was changed to 0.1 mol. The weight average molecular weight Mw of compound A-12 was 2000 in terms of standard polystyrene measured according to GPC.

(Synthesis of Acid Decomposable Compound A-13, for Comparison)

An acid decomposable compound A-13 in a waxy form was prepared in the same manner as in acid decomposable compound A-1, except that 1.0 mol of a xylylene glycol was used instead of 1 mol of ethylene glycol. The weight average molecular weight Mw of compound A-13 was 1500 in terms of standard polystyrene measured according to GPC.

(Synthesis of Acid Decomposable Compound A-14, for Comparison)

An acid decomposable compound A-14 in a waxy form was prepared in the same manner as in acid decomposable compound A-1, except that 1.0 mol of decane-1,10-diol was used instead of 1 mol of ethylene glycol. The weight average molecular weight Mw of compound A-14 was 1500 in terms of standard polystyrene measured according to GPC.

(Synthesis of Acid Decomposable Compound A-15, for Comparison)

An acid decomposable compound A-15 in a solid form was prepared in the same manner as in acid decomposable compound A-1, except that 1.0 mol of ethylene glycol monophenylether was used instead of ethylene glycol, and 0.5 mol of benzaldehyde dimethylacetal were used instead of 1 mol of 1,1-dimethoxycyclohexane.

(Synthesis of Acid Decomposable Compound S-1)

One hundred milliliters of a dichlorodimethylsilane toluene solution in which 1.0 mol of dichlorodimethylsilane was dissolved were dropwise added to a mixture solution of 1.0 mol of tetraethylene glycol, 2.2 mol of pyridine and 800 ml of toluene which was distilled after drying, while cooled with ice. The resulting solution was reacted at 50° C. for 8 hours with stirring, and filtered off to remove pyridine hydrochloride precipitates. The solvent (toluene) of the thus obtained filtrate was removed by evaporation under reduced pressure to obtain a residue. The residue was further dried 80° C. for 10 hours under vacuum to obtain an acid decomposable compound S-1 in a viscous oily form. The weight average molecular weight Mw of compound S-1 was 1500.

(Synthesis of Acid Decomposable Compound S-2)

An acid decomposable compound S-2 in a waxy form was prepared in the same manner as in acid decomposable compound S-1, except that 0.6 mol of tetraethylene glycol and 0.4 mol of p-xylylene glycol were used instead of 1.0 mol of tetraethylene glycol. The weight average molecular weight Mw of compound S-2 was 1700.

(Synthesis of Acid Decomposable Compound S-3)

An acid decomposable compound S-3 in a waxy form was prepared in the same manner as in acid decomposable compound S-1, except that 0.75 mol of tetraethylene glycol and 0.25 mol of p-xylylene glycol were used instead of 1.0 mol of tetraethylene glycol. The weight average molecular weight Mw of compound S-3 was 1800.

(Synthesis of Acid Decomposable Compound S-4, for Comparison)

An acid decomposable compound S-4 in a viscous oily form was prepared in the same manner as in acid decomposable compound S-1, except that 1.0 mol of p-xylylene glycol was used instead of 1.0 mol of tetraethylene glycol. The weight average molecular weight Mw of compound S-4 was 1900.

(Synthesis of Acid Decomposable Compound S-5, for Comparison)

An acid decomposable compound S-5 in a viscous oily form was prepared in the same manner as in acid decomposable compound S-1, except that 1.0 mol of decane-1,10-diol was used instead of 1.0 mol of tetraethylene glycol. The weight average molecular weight Mw of compound S-5 was 2000.

(Synthesis of Acid Decomposable Compound S-6)

An acid decomposable compound S-6 in a waxy form was prepared in the same manner as in acid decomposable compound S-1, except that 1.0 mol of diethylene glycol was used instead of 1.0 mol of tetraethylene glycol. The weight average molecular weight Mw of compound S-6 was 2000.

(Synthesis of Acid Decomposable Compound S-7)

An acid decomposable compound S-7 in a waxy form was prepared in the same manner as in acid decomposable compound S-6, except that 1.0 mol of dichlorodiphenylsilane was used instead of 1.0 mol of dichlorodimethylsilane. The weight average molecular weight Mw of compound S-7 was 1200.

(Compound Capable of Being Insolubilized in an Alkali by an Acid)

A compound capable of being insolubilized in an alkali by an acid (hereinafter referred to as an acid insolubilizing compound) is a compound capable of giving insolubilization in the presence of an acid and lowering solubility in an alkali. The alkali solubility lowering extent in the invention is such that the alkali soluble resin is made insoluble in the alkali, for example, by being cross-linked. Concretely, when the light sensitive material is imagewise exposed which comprises a light sensitive layer containing the alkali soluble resin and acid insolubilizing compound on a support, the alkali soluble resin at exposed portions is made insoluble in an alkali solution as a developer by the acid insolubilizing compound, and remains on the support after development. The acid insolubilizing compound includes a compound having a methylol group or an acetylmethylol group, a melamine resin, a furan resin, an isocyanate, and a blocked isocyanate (an isocyanate having a protective group). The acid insolubilizing compound is preferably a compound having a methylol group or an acetoxymethyl group, or a resol resin.

The acid insolubilizing compound further includes a silanol compound, a carboxylic acid or its derivative, a compound having a hydroxy group, a compound having a cationic ion polymerizable double bond, a secondary or tertiary alcohol having an aromatic ring group, an alkali soluble resin containing an aromatic ring with a methylol group, an alkoxymethyl group or an acetoxymethyl group in its molecule, aminoplasts, a compound represented by formula (p), an alicyclic alcohol, and a heterocyclic alcohol. These will be explained below.

The silanol compound is a compound having one or more hydoxy groups on the average, which combine with a silicon atom, per one silicon atom of the compound. The compound having one or more hydoxy groups on the average herein referred to includes, for example, a compound having one silicon atom which does not combine with a hydroxy group and another one silicon atom which combines with two hydroxy groups. The example of such a silanol compound includes diphenylsilane diol, triphenylsilanol, and cis-(1,3,5,7-tetrahydroxy)-1,3,5,7-tetraphenylcyclohexane. The content of the silanol compound is preferably 5 to 70 weight % based on the radiation sensitive layer.

The carboxylic acid or its derivative includes an aromatic carboxylic acid such as cinnamic acid, benzoic acid, tolylacetic acid, toluilic acid or isophthalic acid; an aromatic ester such as dimethyl isophthalate or di-t-butyl isophthalate; an acid anhydride such as glutaric anhydride, succinic anhydride or benzoic anhydride; and a copolymer such as a styrene-maleic anhydride copolymer or a styrene-methacrylic acid copolymer.

The compound having a hydroxy group includes a polyhydric alcohol such as glycerin; and a high polymer such as poly-p-hydroxystyrene, p-hydroxystyrene-styrene copolymer or a novolak resin.

The carboxylic acid or its derivative and the compound having a hydroxy group are preferably used in combination. The content ratio of the carboxylic acid or its derivative to the compound having a hydroxy group is preferably from 1:30 to 30:1 by mol. When the carboxylic acid or its derivative and the compound having a hydroxy group are used in combination, and the compound having a hydroxy group is a polymeric compound, the amount used of the carboxylic acid or its derivative is preferably from 1 to 50 parts by weight based on 100 parts of the compound having a hydroxy group. When the carboxylic acid or its derivative and the compound having a hydroxy group are used in combination, and the carboxylic acid or its derivative is a polymeric compound, the amount used of the compound having a hydroxy group is preferably from 1 to 20 by weight based on 100 of the carboxylic acid or its derivative.

At least one of the carboxylic acid or its derivative and the compound having a hydroxy group is preferably a polymeric compound, in view of a film forming property. However, if both are a low molucular weight compound, a mixture of the compound and another polymer can form a coating film. The polymer used in admixure is preferably an alkali soluble resin.

A polymer having both hydroxy group and carboxy group or its derivative group can be used. Such a polymer is obtained, for example, by copolymerizing p-hydroxystyrene with a methacrylate such as methylmethacrylate, an acrylate such as methylacrylate, maleic anhydride, methacrylic acid, or acrylic acid. The weight average molecular weight of the polymer is preferably 1,000 to 500,000. The weight average molecular weight of less than 1,000 results in poor heat resistance and poor coatability. The weight average molecular weight exceeding 500,000 results in poor alkali solubility and poor resolving power due to image deformation by swelling. The content of the carboxylic acid or its derivative, or the compound having a hydroxy group is preferably 5 to 70 weight % based on the radiation sensitive layer.

The compound having a cationic ion polymerizable double bond includes p-diisopropenylbenzene, m-diisopropenylbenzene, diphenylethylene, indenone, acenaphthene, 2-norbornene, 2,5-norbornadiene, 2,3-benzofurane, indole, 5-methoxyindole, 5-methoxy-2-methylindole, N-vinyl-2-pyrrolidone, and N-vinylcarbazole. The content of the compound having a cationic ion polymerizable double bond is preferably 5 to 50 weight % based on the radiation sensitive layer.

The secondary or tertiary alcohol having an aromatic ring group includes a biphenyl derivative, a naphthalene derivative, and a triphenyl derivative. Typically, the secondary or tertiary alcohol includes a compound represented by the following formula (a), (b), (c), or (d):

formula (a)

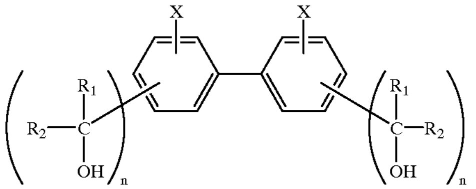

formula (b)

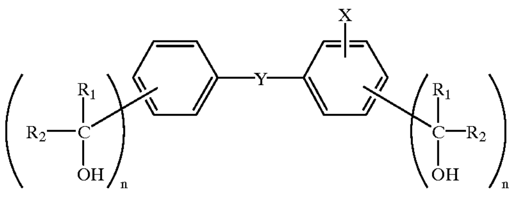

-continued formula (c)

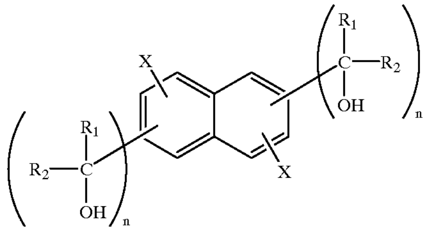

formula (d)

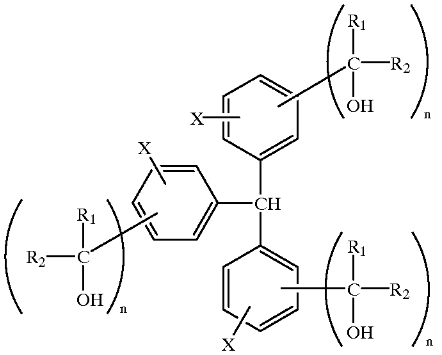

In formulae (a) through (d), $R_1$ and $R_2$ may be the same as or different from each other, and independently represent a hydrogen atom, methyl or ethyl; X represents a hydrogen atom, a halogen atom, methyl or methoxy; Y represents —$SO_2$—, —$CH_2$—, —S—, or —$C(CH_3)_2$—; and n represents 1 or 2.

The example of the biphenyl derivative includes 4,4'-bis(α-hydroxy-isopropyl)biphenyl, 3,3'-bis(α-hydroxyisopropyl)biphenyl, 2,4,2',4'-tetra(α-hydroxyisopropyl)biphenyl, 3,5,3',5'-tetra(α-hydroxyisopropyl)biphenyl, 4,4'-bis(α-hydroxyisopropyl) biphenylsulfone, 3,3'-bis(α-hydroxyisopropyl) biphenylsulfone, 4,4'-bis(α-hydroxyisopropyl) biphenylmethane, 3,3'-bis(α-hydroxyisopropyl) biphenylmethane, 4,4'-bis(α-hydroxyisopropyl) biphenylsulfide, 3,3'-bis(α-hydroxyisopropyl) biphenylsulfide, 2,2'-bis(4-α-hydroxyisopropylphenyl) propane, and 2,2-bis(3-α-hydroxyisopropylphenyl)propane. The example of the naphthalene derivative includes 1,5-bis (1-hydroxypropyl)naphthalene, and 2,6-bis(α-hydroxypropyl)naphthalene. The example of the triphenyl derivative includes tris(4-α-hydroxyisopropylphenyl) methane, tris(3-α-hydroxyisopropylphenyl)methane, 1,1,1-tris (4-α-hydroxyisopropylphenyl)ethane, and 1,1,1-tris(3-α-hydroxyisopropylphenyl)ethane.

The secondary or tertiary alcohol further includes a compound represented by the following formula (e), (f), or (g):

formula (e)

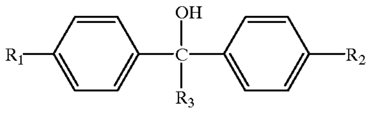

-continued formula (f)

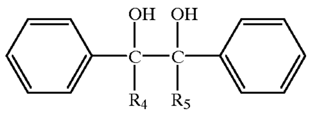

formula (g)

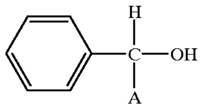

In formula (e), $R_1$ and $R_2$ may be the same as or different from each other, and independently represent a hydrogen atom, a halogen atom, or methoxy; and $R_3$ represents a hydrogen atom, a phenyl group or a cyclopropyl group. In formula (f), $R_4$ and $R_5$ may be the same as or different from each other, and represents a hydrogen atom, or a phenyl group. In formula (g), A represents an alkyl group having 1 to 4 carbon atoms or a methylol group.

The secondary or tertiary alcohol, in which a carbon atom combining with an aromatic ring, has a hydroxy group includes phenylmethanol derivatives and alicyclic alcohol having an aromatic ring.

The phenylmethanol derivatives include diphenylmethanol, 4,4'-difluorodiphenylmethanol, 4,4'-dichloro-diphenylmethanol, 4,4'-dimethyl-diphenylmethanol, 4,4'-dimethoxy-diphenylmethanol, triphenylmethanol, α-(4-pyridyl)-benzhydrol, benzylphenylmethanol, 1,1-diphenylethanol, cyclopropyldiphenylmethanol, 1-phenylethylalcohol, 2-phenyl-2-propanol, 2-phenyl-2-butanol, 1-phenyl-1-butanol, 2-phenyl-3-butine-2-ol, 1-phenyl-1-propanol, 1,2-diphenylethylene glycol, tetraphenylethylene glycol, 2,3-diphenyl-2,3-butanediol, α-naphtholbenzein, α,α'-dihydroxy-p-diisopropylbenzene, naphtholbenzoine, and α,α'-dihydroxy-m-diisopropylbenzene.

The alicyclic alcohol having an aromatic ring includes 1-indanol, 2-bromoindanol, chromanol, 9-fluorenol, 9-hydroxy -3-fluorene, 9-hydroxyxanthene, 1-acenaphtenol, 9-hydroxy-3-nitrofluorene, thiochromane-4-ol, 9-phenylxanthene-9-ol, 1,5-dihydroxy-1,2,3,4-tetrahydronaphthalene, dibenzosuberenol and dibenzosuberol.

The secondary or thrtiary alcohol further includes 1-(9-anthryl)ethanol, 2,2,2-trifluoro-1-(9-anthryl)ethanol, and 1-naphthylethanol.

The alkali soluble resin containing an aromatic ring with a methylol group, an alkoxymethyl group or an acetoxymethyl group in its molecule includes a polymer having a substituted phenyl or phenylene group in which one or two hydrogen atoms are extracted from the following formula (h):

formula (h)

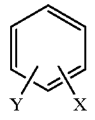

In formula (h), X represents a methylol group, an alkoxymethyl group in which the alkoxy has 1 to 5 carbon atoms, or an acetoxymethyl group; and Y represents a hydrogen atom, a halogen atom, an alkyl group, a hydroxy group or an alkoxy group.

The alkali soluble resin is preferably a polymer having a repeating unit represented by the following formula (i) or (j):

formula (i)

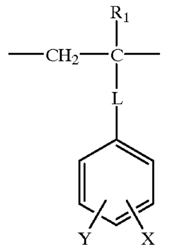

formula (j)

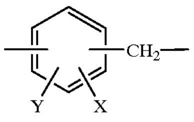

In formula (i) or (j), $R_1$ represents a hydrogen atom, a halogen atom, an alkyl group, or a cyano group; L represents a single bond, —O—, —O—CO—, —$CONR_3$—, —$CONR_3CO$—, —$CONR_3SO_2$—, —$NR_3$—, —$NR_3CO$—, —$NR_3SO_2$—, —$SO_2$—, —$SO_2NR_3$— or —$SO_2NR_3CO$—, in which $R_3$ represents a hydrogen atom, an alkyl group, an aralkyl group or an aromatic ring group); and X and Y are the same as denoted in formula (h).

The alkali soluble resin is preferably a copolymer having a repeating unit represented by formula (i) or (j), and a unit from a monomer such as vinylbenzyl alcohol, α-methylvinylbenzyl alcohol, vinylbenzyl acetate, α-methylvinylbenzyl acetate, p-methoxystyrene, or 4-methylolphenyl methacrylamide.

The aminoplast is preferably a compound represented by the following formula (k):

formula (k)

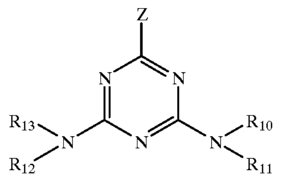

In formula (k), Z represents —NRR' or a phenyl group; and R, R', $R_{10}$, $R_{11}$, $R_{12}$, and $R_{13}$ independently represent a hydrogen atom, —$CH_2OH$, —$CH_2ORa$ or —COORa in which Ra represents an alkyl group.

Melamine or benzoguanamine represented by formula (k) is available on the market, and methylol derivatives thereof are obtained by condensation reaction of melamine or benzoguanamine with formalin. The ethers thereof are obtained by reaction of the methylols with alcohols. In formula (k), the alkyl group represented by Ra is preferably a straight-chained or branched alkyl group having 1 to 4 carbon atoms.

The examples of the compound represented by formula (k) are listed below, but not limited thereto.

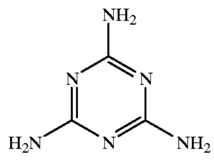
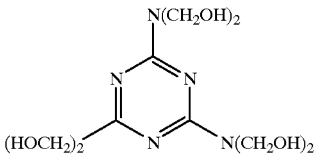
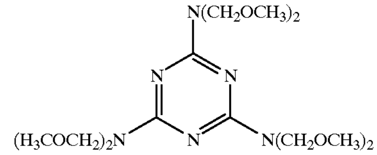
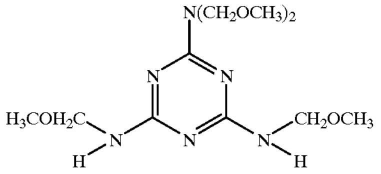
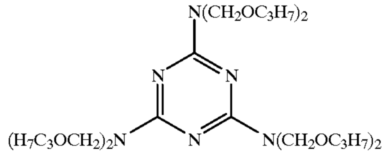
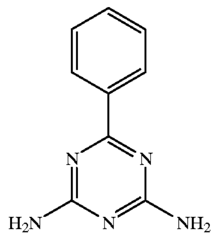
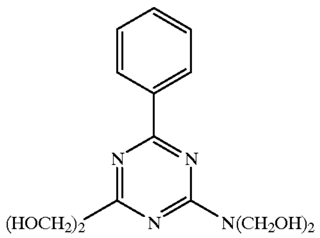
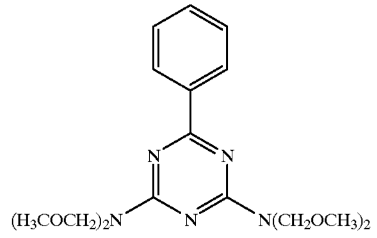
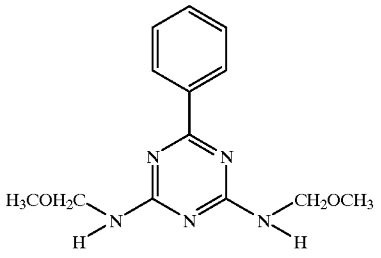
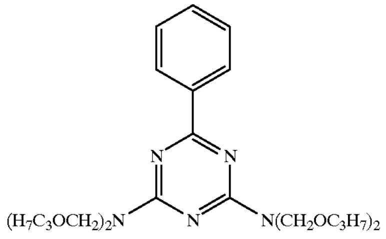

-continued

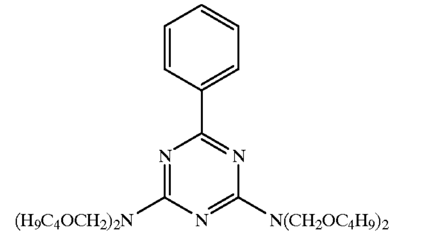

As the aminoplast, a compound represented by the following formula (l), a melamine resin represented by the following formula (m), a compound represented by the following formula (n) or a compound represented by the following formula (o) can be also used.

formula (l)

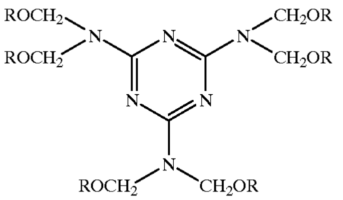

formula (m)

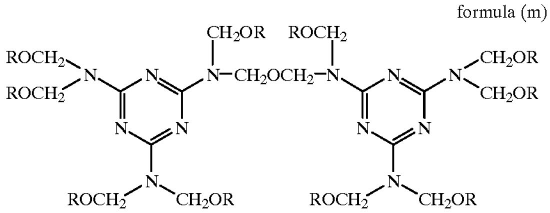

formula (n)

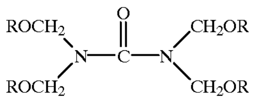

formula (o)

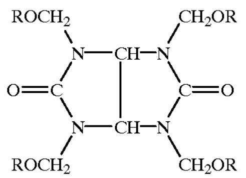

In formula (l), (m), (n) or (o), R represents an alkyl group having 1 to 4 carbon atoms.

The compound represented by formula (p) is as follows:

formula (p)

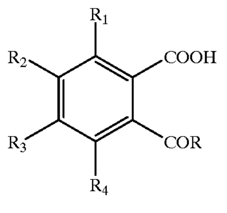

In formula (p), R represents a hydrogen atom, an alkyl group having 1 to 3 carbon atoms, an aryl group or a tolyl group; and $R_1$, $R_2$, $R_3$, and $R_4$ independently represent a hydrogen atom, an alkyl group having 1 to 3 carbon atoms, or an alkoxy group having 1 to 3 carbon atoms.

As the compound represented by formula (p), o-acetylbenzoic acid, o-aldehyde benzoic acid, o-benzoylbenzoic acid, o-toluoylbenzoic acid, or o-acetoxybenzoic acid is preferably used. The content of the compound represented by formula (p) in the radiation sensitive layer is suitably 5 to 50 weight %, and preferably 10 to 30 weight %, based on the radiation sensitive layer.

The alicyclic alcohol includes 2-adamantanol, 2-methyl-2-adamantanol, 2-ethyl-2-adamantanol, 2-propyl-2-adamantanol, 2-butyl-2-adamantanol, exo-norborneol, endo-norborneol, borneol, DL-isoborneol, terpinen-4-ol, S-cis-verbenol, isopinocampheol, and pinane-diol.

The heterocyclic alcohol includes 1,4-dioxane-2,3-diol, 5-methyl-1,4-dioxane-2,3-diol, 5,6-dimethyl-1,4-dioxane-2,3-diol, DL-exo-hydroxytropinone, 4-hydroxy-4-phenylpiperidine, 3-quinucilidinol, 4-chromanol, and thiochroman-4-ol. The heterocyclic alcohol is preferably those containing O or S in its heterocyclic ring.

The content of the alicyclic alcohol or heterocyclic alcohol in the radiation sensitive layer is suitably 5 to 50 weight %, and preferably 10 to 30 weight %, based on the radiation sensitive layer.

(Dye)

The dye used in the radiation sensitive composition is a dye having an absorption band in the wavelength region of from 700 to 1200 nm. The dye is preferably an infrared absorbent, carbon black or magnetic powder each having absorption in the wavelength region of 700 nm or more. The especially preferable infrared absorbent has an absorption maximum in the wavelength range of 700 nm to 1200 nm and having a molar extinction coefficient, $\epsilon$ of $10^5$ or more.

The above infrared absorbent includes cyanine dyes, squarylium dyes, chloconium dyes, azulenium dyes, phthalocyanine dyes, naphthalocyanine dyes, polymethine dyes, naphthoquinone dyes, thiopyrilium dyes, dithiol metal complex dyes, anthraquinone dyes, indoaniline metal complex dyes and intermolecular charge transfer complex dyes. The above described infrared absorber includes compounds disclosed in Japanese Patent O.P.I. Publication Nos. 63-139191/1988, 64-33547/1989, 1-160683/1989, 1-280750/1989, 1-293342/1989, 2-2074/1990, 3-26593/1991, 3-30991/1991, 3-34891/1991, 3-36093/1991, 3-36094/1991, 3-36095/1991, 3-42281/1991 and 3-103476/1991.

In the invention, the infrared absorbent is especially preferably a cyanine dye represented by the following formula (2) or (3):

formula (2)

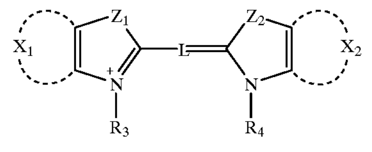

formula (3)

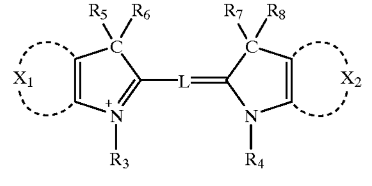

wherein $Z_1$ and $Z_2$ independently represent a sulfur atom, a selenium atom or an oxygen atom; $X_1$ and $X_2$ independently represent a non-metallic atomic group necessary to form a benzene or naphthalene ring, which may have a substituent;

$R_3$ and $R_4$ independently represent a substituent, provided that one of $R_3$ and $R_4$ represents an anionic group, $R_5$, $R_6$, $R_7$ and $R_8$ independently represent a hydrogen atom, a halogen atom or an alkyl group having 1 to 3 carbon atoms; and L represents a linkage with a conjugated bond having 5 to 13 carbon atoms.

The cyanine dye represented by formula (2) or (3) includes a cyanine dye in which formula (2) or (3) itself forms a cation in its intramolecule and has an anionic group as a counter ion. The anionic group includes $Cl^-$, $Br^-$, $ClO_4^-$, $BF_4^-$, and an alkyl borate anion such as a t-butyltriphenyl borate anion.

The carbon number (n) in the linkage with a conjugated bond represented by L of formula (2) or (3) is preferably selected to match with wavelength of light emitted from an infrared laser used for exposure as a light source. For example, when a YAG laser, which emits 1060 nm light, is used, n is preferably 9 to 13. The conjugated bond may have a substituent, and may form a ring together with another atomic group. The substituent of the ring represented by $X_1$ or $X_2$ may be any, but is preferably a group selected from the group consisting of a halogen atom, an alkyl group having 1 to 5 carbon atoms, an alkoxy group having 1 to 5 carbon atoms, $—SO_3M$, and —COOM (in which M represents a hydrogen atom or an alkali metal atom). The substituent of $R_3$ and $R_4$ may be any, but is preferably an alkyl group having 1 to 5 carbon atoms, an alkoxy group having 1 to 5 carbon atoms, or $—((CH_2)_n—O—)_k—(CH_2)_mOR$ (in which n and m independently represent an integer of 1 to 3, k represents 0 or 1, and R represents an alkyl group having 1 to 5 carbon atoms), or preferably one of $R_3$ and $R_4$ represents $—RSO_3M$, and the other $—RSO_3^-$, in which R represents an alkylene group having 1 to 5 carbon atoms, and M represents an alkali metal atom, or preferably one of $R_3$ and $R_4$ represents —RCOOM, and the other $—RCOO^-$, in which R represents an alkylene group having 1 to 5 carbon atoms, and M represents an alkali metal atom. It is more preferable in view of sensitivity or developability that one of $R_3$ and $R_4$ represents $—RSO_3M$ or —RCOOM, and the other $—RSO_3^-$ or $—RCOO^-$.

When a semiconductor laser is used for exposure as a light source, a dye is preferably an infrared absorbent having an absorption peak in the range of 750 to 900 nm and a molar extinction coefficient $\epsilon$ exceeding $1\times10^5$, and when a YAG laser is used for exposure as a light source, a dye is preferably an infrared absorbent having an absorption peak in the range of 900 to 1200 nm and a molar extinction coefficient $\epsilon$ exceeding $1\times10^5$. These infrared absorbents can be used in combination of two or more kinds.

The examples of the infrared absorbent preferably used in the invention are listed below, but are not limited thereto.

IR1

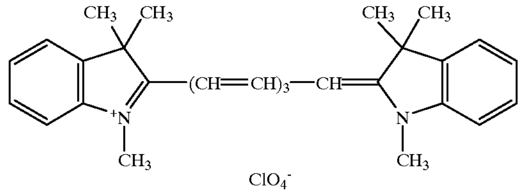

IR2

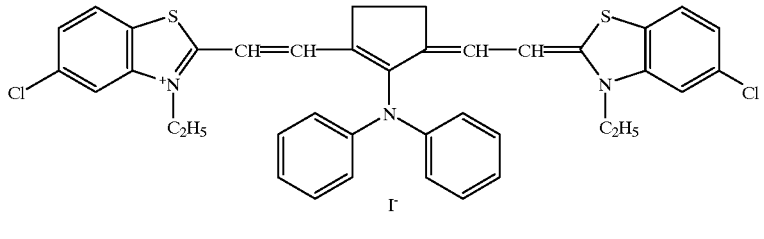

IR3

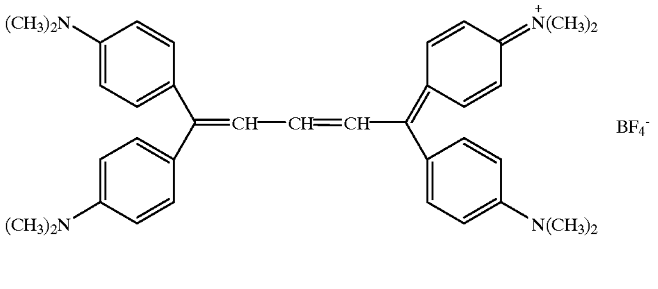

IR4

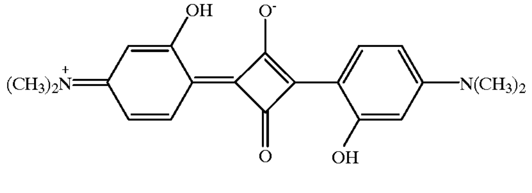

-continued
IR5
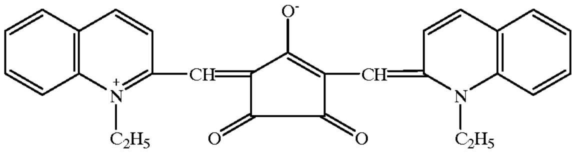
IR6
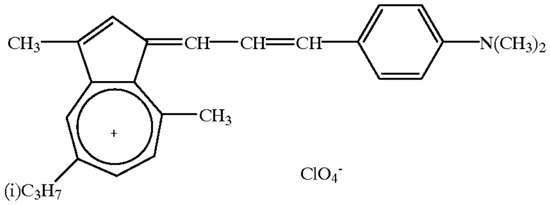
IR7
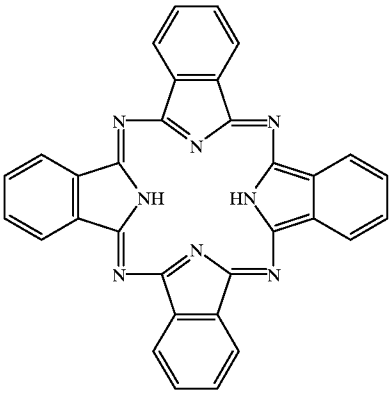
IR8
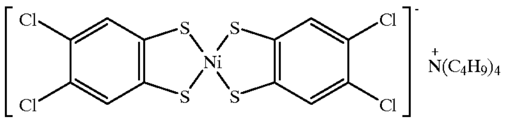
IR9
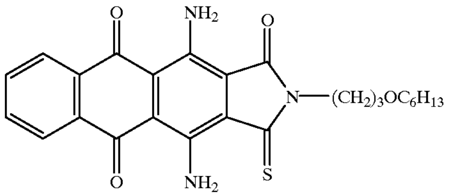
IR10
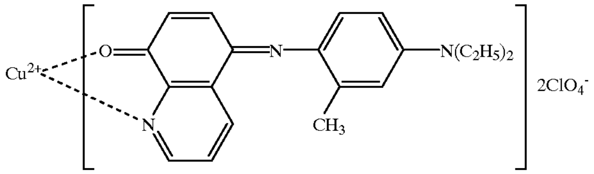
IR11
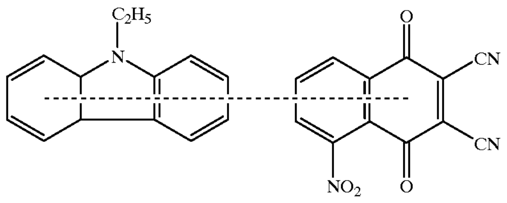

-continued
IR12
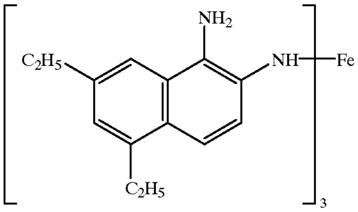
IR13
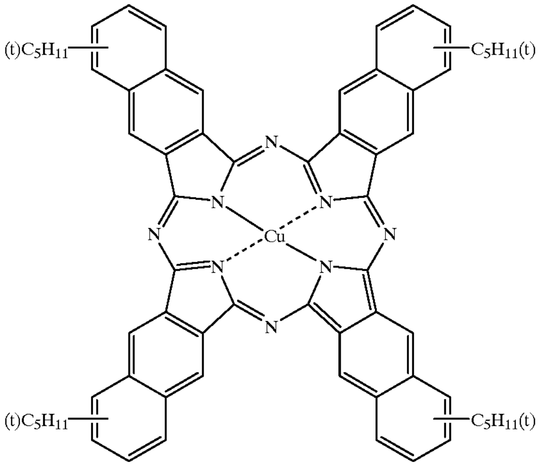
IR14
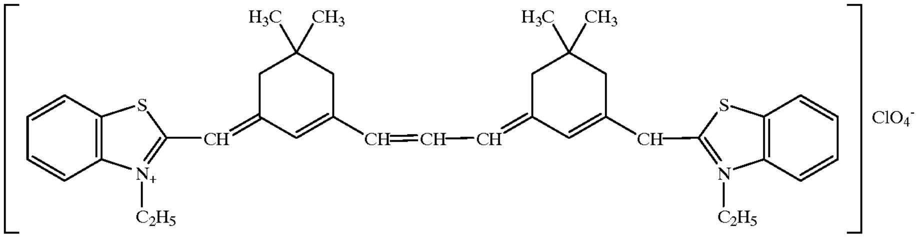
IR15
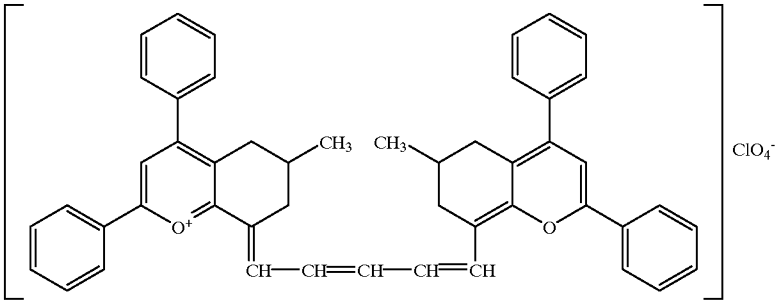

-continued
IR16
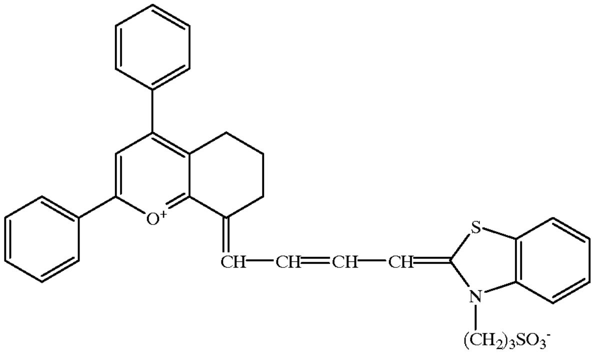
IR17
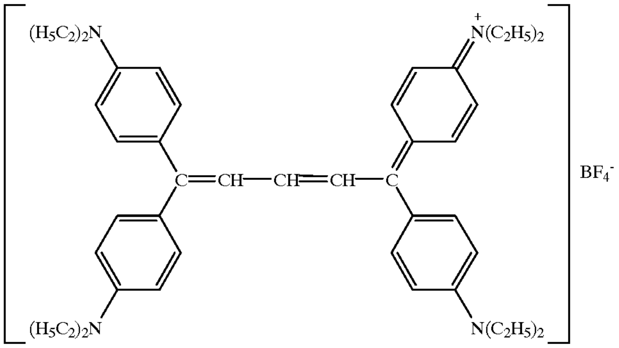
IR18
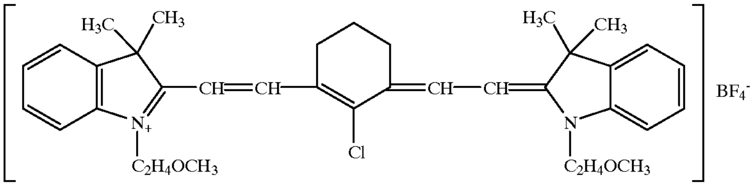
IR19
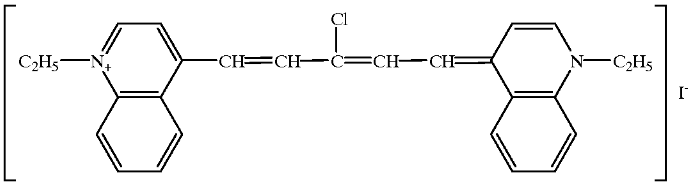
IR20
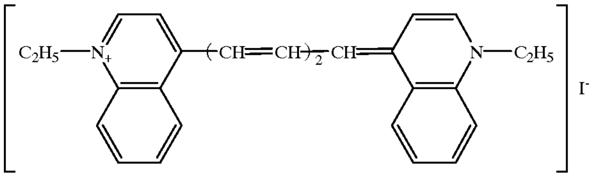
IR21
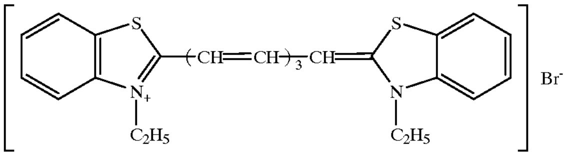

-continued
IR22
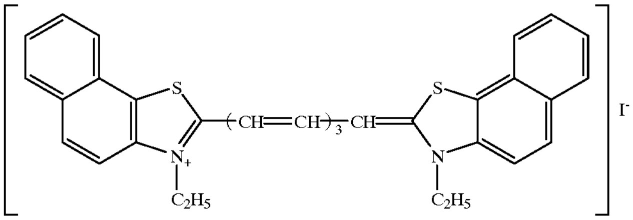
IR23
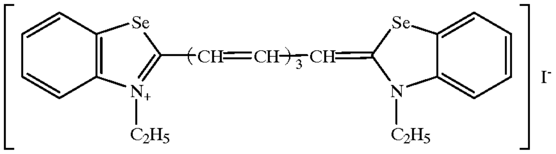
IR24
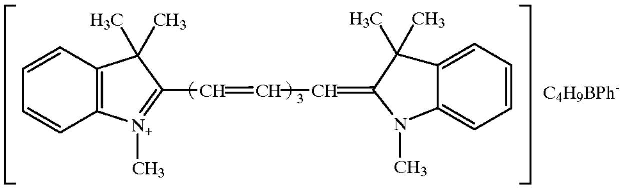
IR25
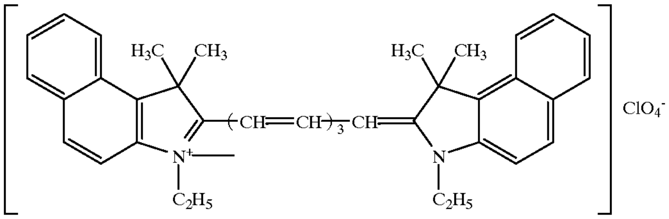
IR26
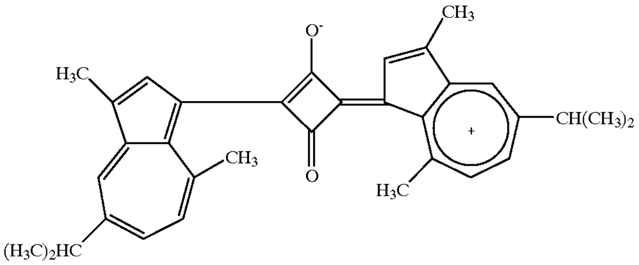
IR27
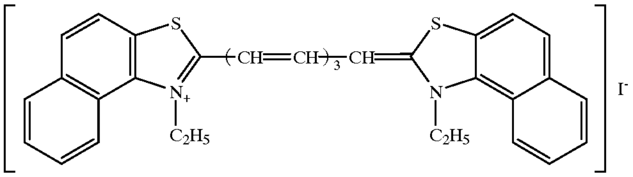

-continued
IR28
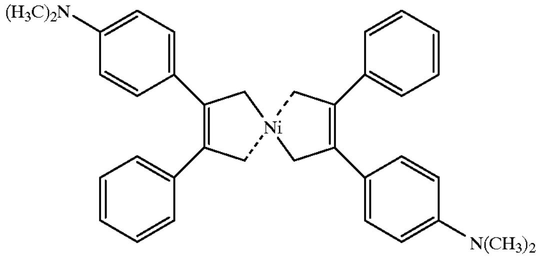
IR29
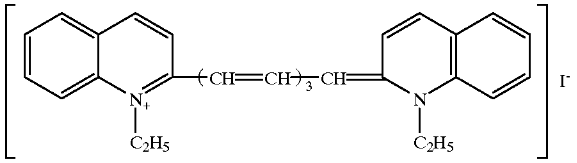
IR30
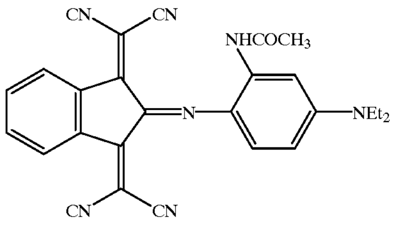
IR31
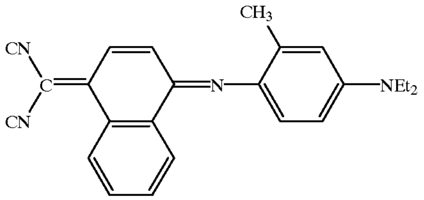
IR32
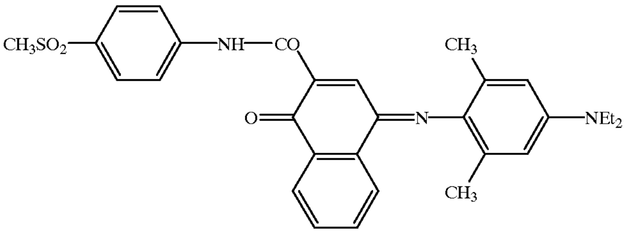
IR33
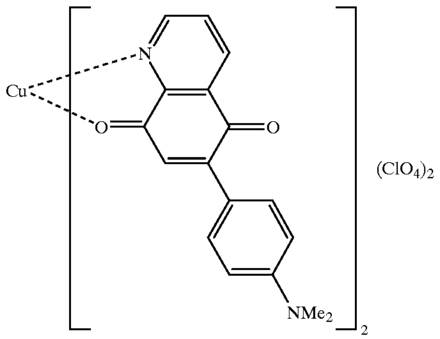

-continued
IR34
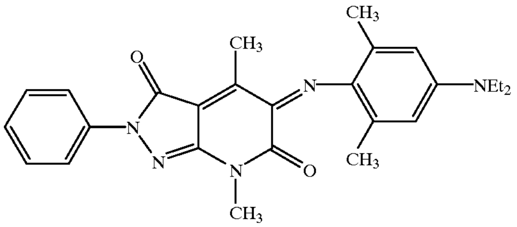
IR35
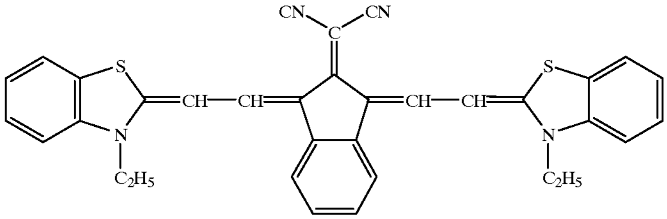
IR36
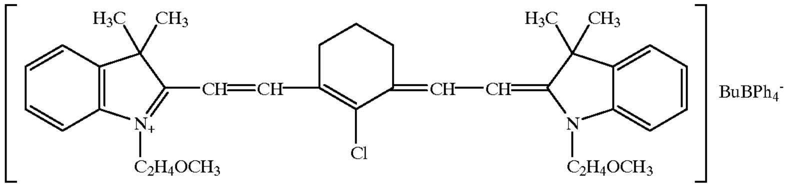
IR37
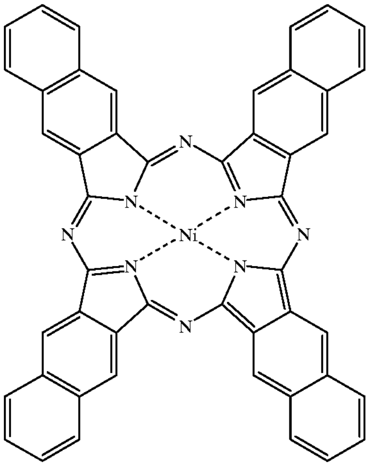
IR38
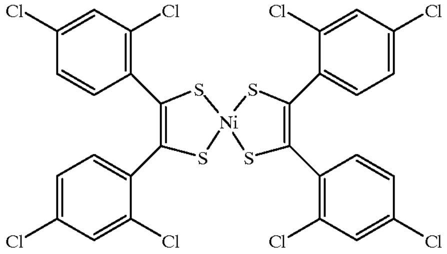

-continued
IR39
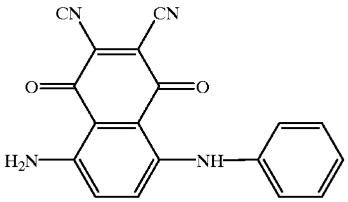
IR40
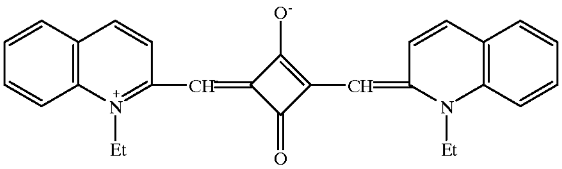
IR41
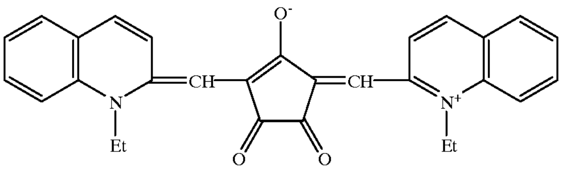
IR42
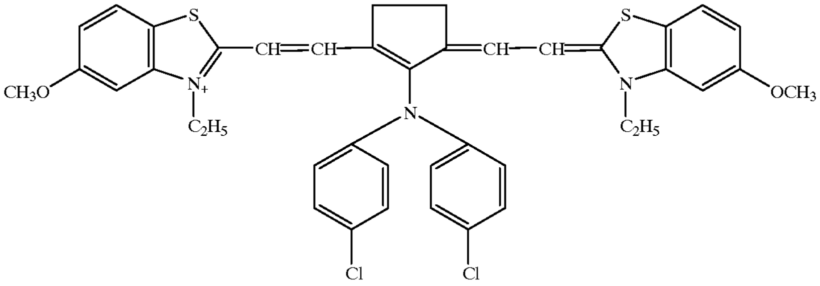
IR43
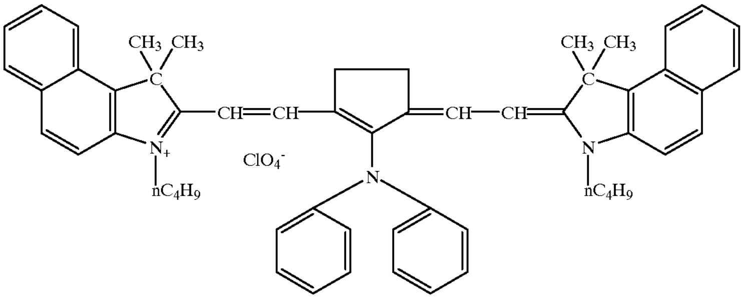
IR44
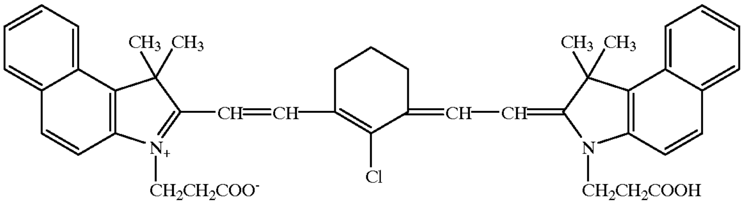

-continued
IR45
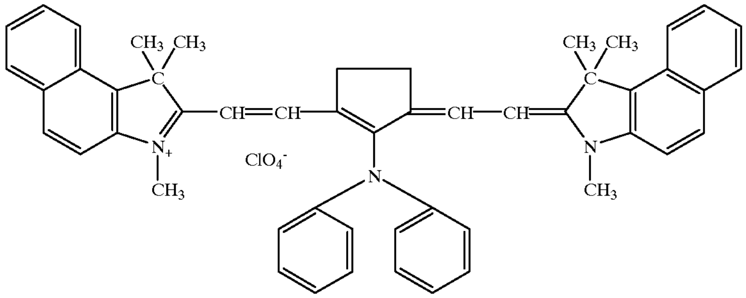
IR46
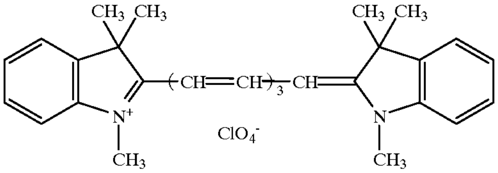
IR47
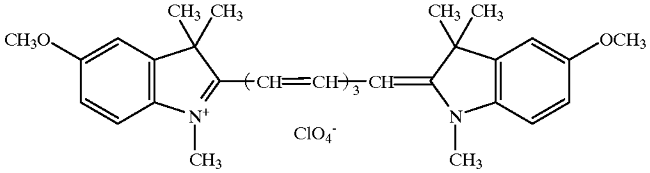
IR48
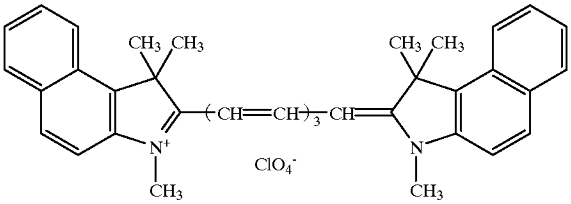
IR49
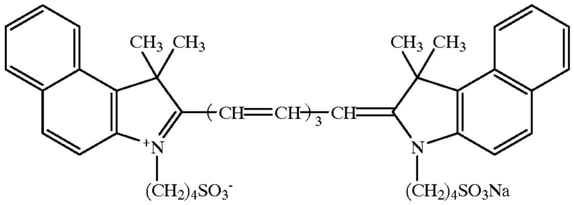
IR50
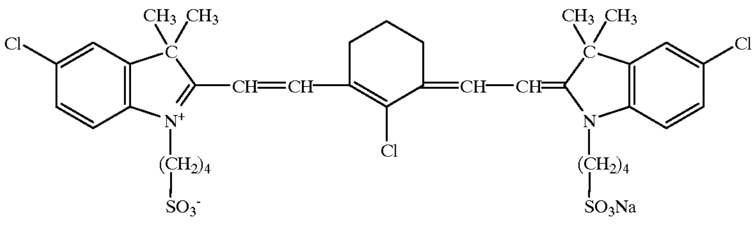
IR51
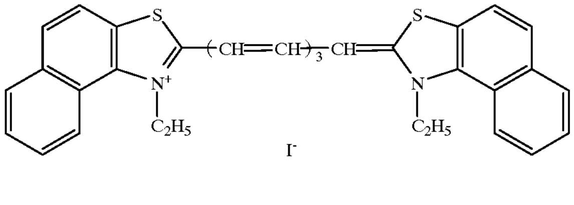

-continued

IR52

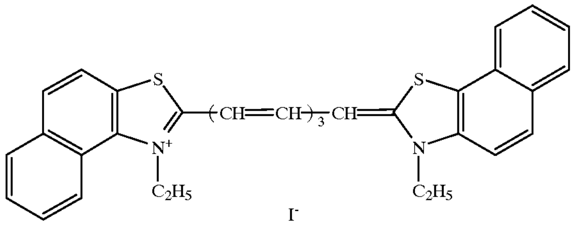

IR53

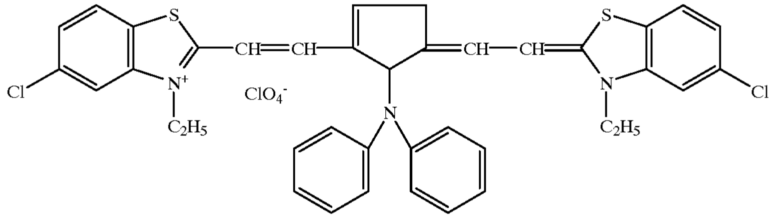

IR54

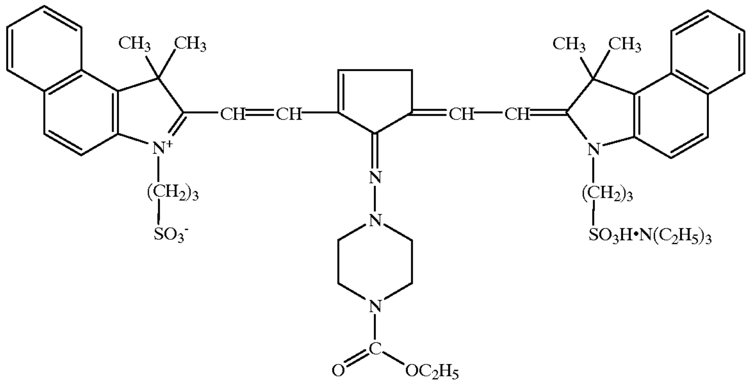

IR55

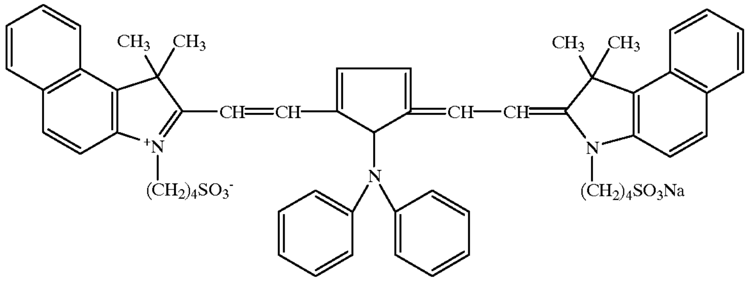

These dyes can be obtained by a conventional synthetic method, and the following commercially available dyes can be used:

IR750 (antraquinone type); IR002 and IR003 (aluminum type), IR820 (polymethine type); IRG022 and IRG033 (diimmonium type); CY-2, CY-4, CY-9 and CY-20, each produced by Nihon Kayaku Co., Ltd.;

KIR103 and SIR103 (phthalocyanine type); KIR101 and SIR114 (antraquinone type); PA1001, PA1005, PA1006 and SIR128, (metal complex type), each produced by Mitsui Toatsu Co., Ltd.;

Fastogen Blue 8120 produced by Dainihon Ink Kagaku Co., Ltd.; and

MIR-101,1011, and 1021 each produced by Midori Kagaku Co., Ltd.

Other infrared dyes are sold by Nihon Kankoshikiso Co., Ltd., Sumitomo Kagaku Co., Ltd. or Fuji Film Co., Ltd.

In the invention, the infrared absorbent content of the radiation sensitive layer is preferably 0.5 to 5% by weight based on the total weight of radiation sensitive layer.

When a radiation sensitive composition comprising pigment is applied to a presensitized planographic printing plate, it provides a planographic printing plate with greatly improved printing durability. The pigment includes conventional organic or inorganic pigments, and pigment disclosed in “Shikizai Kogaku Handbook” published by Asakura Shoten, or in “Ganryo Binran” published by Seibundo Shinko Sha can be used without limitations. In order to obtain a visible image after development, pigment is preferably a colored pigment, and more preferably pigment giving a high. In view of the above, pigment is preferably phthalocyanine or carbon black, which provides high printing durability and a visible image after development.

(Dyestuff)

The dyestuff herein referred to is used for obtaining a visible image after exposure (image visualized by exposure) or a visible image after development.

The dyestuff is preferably a dyestuff varying its color on reaction with a free radical or an acid. The term "varying its color" includes changing colorless to color, color to colorless or changing its color. The preferable dyestuff is a dyestuff varying its color by forming a salt with an acid.

The examples of the dyestuff changing its color to colorless or changing its color include a triphenylmethane dye such as Victoria Pure Blue BOH (produced by Hodogaya Kagaku Co. Ltd.), Oil Blue #603 (produced by Orient Kagaku Co. Ltd.), Patent Pure Blue (produced by Sumitomomikuni Kagaku Co. Ltd.), Crystal Violet, Brilliant green, Ethyl Violet, Methyl Violet, Methyl Green, Erythrosine B, Basic Fuchsin, Malachite Green, Oil red, m-Cresol Purple, Rhodamine B, Auramine, 4-p-diethylaminophenyliminonaphthoquinone or cyano-p-diethylaminophenylacetoanilide or a diphenylmethane, oxazine, xanthene, iminonaphthoquinone, azomethine or anthraquinone dye.

The examples of the dyestuff changing from colorless to color include a leuco dye or a primary or secondary amine such as triphenylamine, diphenylamine, o-chloroaniline, 1,2,3-triphenylguanidine naphthylamine, diaminodiphenylmethane, p,p'-bis-dimethylaminodiphenylamine, 1,2-dianilinoethylene, p,p', p"-tris-dimethylaminotriphenylmethane, p,p'-bis-dimethylaminodiphenylmethylimine, p,p',p"-triamino-o-methyltriphenylmethane or p,p'-bis-dimethylaminodiphenyl-4-anilinonaphthylmethane. The dyestuff content of the radiation sensitive layer is preferably 0.02 to 10% by weight, and more preferably 0.02 to 5% by weight, based on the total weight of radiation sensitive layer. The dyestuff can be used alone or as a mixture of two or more thereof. The especially preferable dyestuff is Victoria Pure Blue BOH or Oil Blue #603.

(Binder)

A binder (hereinafter referred to as also an alkali soluble resin), which is insoluble in water and soluble in an alkali, is preferably contained in the radiation sensitive layer in the invention. Such a binder includes a novolak resin, a polymer having a phenolic hydroxy group (for example, a polymer having a hydroxystyrene monomer unit or an N-4-hydroxyphenyl methacrylamide monomer unit), and a polymer having an acrylate monomer unit.

The novolak resin includes a phenol.formaldehyde resin, a cresol.formaldehyde resin, a phenol.cresol.formaldehyde resin disclosed in Japanese Patent O.P.I. Publication No. 55-57841/1980 and a polycondensation resin of a p-substituted phenol or phenol and cresol with formaldehyde.

The polymer having a hydroxystyrene monomer unit includes a homopolymer or copolymer of hydroxystyrene disclosed in Japanese Patent Publication No. 52-41050/1977.

The polymer having an acrylate monomer unit includes a polymer having an alkylacrylate or alkylmethacrylate monomer unit (in which the alkyl may be substituted or unsubstituted). The alkylacrylate or alkylmethacrylate includes methylacrylate, ethylacrylate, propylacrylate, butylacrylate, amylacrylate, hexylacrylate, heptylacrylate, octylacrylate, nonylacrylate, decylacrylate, undecylacrylate, dodecylacrylate, benzylacrylate, cyclohexylacrylate, 2-chloroethylacrylate, N,N-dimethylaminoethylacrylate, glycidylacrylate, methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, benzylmethacrylate, cyclohexylmethacrylate, 2-chloroethylmethacrylate, N,N-dimethylaminoethylmethacrylate, and glycidylmethacrylate.

Among these polymers is preferable a copolymer obtained by copolymerizing a mixture of the following monomers.

(1) A monomer having an aromatic hydroxy group, for example, o-hydroxystyrene, p-hydroxystyrene, m-hydroxystyrene, o-hydroxyphenylacrylate, p-hydroxyphenylacrylate, m-hydroxyphenylacrylate, (2) A monomer having an aliphatic hydroxy group, for example, 2-hydroxyethylacrylate, 2-hydroxyethylmethacrylate, N-methylolacrylamide, N-methylolmethacrylamide, 4-hydroxybutylacrylate, 4-hydroxybutylmethacrylate, 5-hydroxypentylacrylate, 5-hydroxypentylmethacrylate, 6-hydroxyhexylacrylate, 6-hydroxyhexylmethacrylate, N-(2-hydroxyethyl)acrylamide, N-(2-hydroxyethyl)methacrylamide, hydroxyethylvinyl ether, (3) A monomer having an aminosulfonyl group, for example, m-aminosulfonylphenyl methacrylate, p-aminosulfonylphenyl methacrylate, m-aminosulfonylphenyl acrylate, p-aminosulfonylphenyl acrylate, N-(p-aminosulfonylphenyl)methacrylamide, N-(p-aminosulfonylphenyl)acrylamide, (4) A monomer having a sulfonamido group, for example, N-(p-toluenesulfonyl)acrylamide, N-(p-toluenesulfonyl)methacrylamide, (5) An α,β-unsaturated carboxylic acid, for example, acrylic acid, methacrylic acid, maleic acid, maleic anhydride, itaconic acid, itaconic anhydride, (6) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, N-4-hydroxyphenylmethacrylamide, (7) A monomer having a fluorinated alkyl group, for example, trifluoroethylacrylate, trifluoroethylmethacrylate, tetrafluoropropylmethacrylate, hexafluoropropylmethacrylate, octafluoropentylacrylate, octafluoropentylmethacrylate, heptadecafluorodecylmethacrylate, N-butyl-N-(2-acryloxyethyl)heptadecafluorooctylsulfonamide, (8) A vinyl ether, for example, ethylvinyl ether, 2-chloroethylvinyl ether, propylvinyl ether, butylvinyl ether, octylvinyl ether, phenylvinyl ether, (9) A vinyl ester, for example, vinyl acetate, vinyl chroloacetate, vinyl butate, vinyl benzoate,

(10) A styrene, for example, styrene, methylstyrene, chloromethystyrene,

(11) A vinyl ketone, for example, methylvinyl ketone, ethylvinyl ketone, propylvinyl ketone, phenylvinyl ketone,

(12) An olefin, for example, ethylene, propylene, isobutylene, butadiene, isoprene,

(13) N-vinylpyrrolidone, N-vinylcarbazole, N-vinylpyridine,

(14) A monomer having a cyano group, for example, acrylonitrile, methacrylonitrile, 2-pentenenitrile, 2-methyl-3-butene nitrile, 2-cyanoethylacrylate, o-cyanostyrene, m-cyanostyrene, p-cyanostyrene,

(15) A monomer having an amino group, for example, N,N-diethylaminoethylmethacrylate, N,N-dimethylaminoethylacrylate, N,N-dimethylaminoethylmethacrylate, polybutadiene urethaneacrylate, N,N-dimethylaminopropylacrylamide, N,N-dimethylacrylamide, acryloylmorpholine, N-isopropylacrylamide, N,N-diethylacrylamide.

The above described polymer has a weight average molecular weight of preferably 10,000 to 200,000, measured according to GPC, but the weight average molecular weight is not limited thereto.

Another polymer used as a binder in combination includes polyester, polyvinyl acetal, polyurethane, polyamide, cellulose, polyolefin, polyvinyl chloride, polystyrene, polycarbonate, polyvinyl alcohol, polyvinyl pyrrolidone, polysulfon, polycaprolactone, polyacrylonitrile, a urea resin, an epoxy resin, a phenoxy resin, and a rubber resin. A resin having an unsaturated bond in its molecule, for example, a diallylphthalate resin or its derivative, or chlorinated polypropylene, can be suitably used according to its usage, since it can be copolymerized with the above described compound having an ethylenically unsaturated bond.

The alkali soluble resin content of the radiation sensitive layer is preferably 20 to 90% by weight, and more preferably 30 to 70% by weight, based on the total weight of radiation sensitive layer.

The novolak resin, and one of the polymer having a hydroxystyrene monomer unit and a polymer having an acrylate monomer unit are preferably used in combination in the radiation sensitive layer. The content ratio of the novolak resin to the polymer having a hydroxystyrene monomer unit or a polymer having an acrylate monomer unit is preferably from 30/70 to 95/5.

The radiation sensitive layer in the invention may contain a lipophilic resin to increase lipophilicity of the layer. The lipophilic resin includes a polycondensate of phenols with an alkyl group having 3 to 15 carbon atoms with aldehydes, for example, a t-butylphenol-formaldehyde resin disclosed in Japanese Patent O.P.I. Publication No. 50-125806/1975.

The radiation sensitive layer in the invention optionally contains nitrocellulose, a self-oxidation compound such as metal powder, or a UV absorbent.

(2) Manufacturing method of image forming material

The image forming material of the invention is manufactured by dissolving the above described component in the following solvent to obtain a coating solution, coating the solution on a support, and then drying.

The solvent includes propylene glycol monomethylether, propylene glycol monoethylether, methylcellosolve, methylcellosolve acetate, ethylcellosolve, ethylcellosolve acetate, dimethylformamide, dimethylsulfoxide, dioxane, acetone, cyclohexanone, trichloroethylene, methyl ethyl ketone, methyl lactate, ethyl lactate, and dimethylacetoamide. These solvents can be used alone or as a mixture of two or more thereof.

The pH of the coating solution can be adjusted in order to improve storage stability and minimize lowering of small dot reproduction during storage. The coating solution has a pH of preferably 3.5 to 8.0, and more preferably 4.0 to 6.5. The coating solution having less than 3.5 does not show the effects of the invention, and the coating solution exceeding pH 8.0 results in sensitivity lowering.

As a pH adjusting agent a basic compound can be preferably used. The basic compound is capable of trapping proton, and the example thereof includes inorganic or organic ammonium salts, organic amines, amides, urea or thiourea and its derivatives, thiazoles, pyrroles, pyrimidines, piperazines, guanidines, indoles, imidazoles, imidazolines, triazoles, morpholines, piperidines, amidines, formamidines, pyridines, a Shiff base, a sodium or potassium salt of a weak acid, a basic nitrogen-containing compound described in Japanese Patent O.P.I. Publication No. 8-234030, a thiosulfonate compound described in Japanese Patent O.P.I. Publication No. 8-211598, and a basic compound (a sulfonylhydrazide compound) to be neutralized after heating described in Japanese Patent O.P.I. Publication No. 7-219217. The light sensitive composition layer containing the basic compound to be neutralized after heating exhibits high sensitivity by being heated (post-baked) after exposure and before development. The examples thereof are listed below.

The basic compounds include ammonium acetate, methylamine, dimethylamine, trimethylamine, ethylamine, diethylamine, triethylamine, n-propylamine, di-n-propylamine, tri-n-propylamine, isopropylamine, sec-butylamine, tert-butylamine, cyclohexylamine, tribenzylamine, octadecylbenzylamine, stearylamine, α-phenylethylamine, β-phenylethylamine, ethylenediamine, tetramethylenediamine, hexamethylenediamine, tetramethylammonium hydroxide, aniline, methylaniline, dimethylaniline, diphenylaniline, triphenylaniline, o-toluidine, m-toluidine, p-toluidine, o-anisidine, m-anisidine, p-anisidine, o-chloroaniline, m-chloroaniline, p-chloroaniline, o-bromoaniline, m-bromoaniline, p-bromoaniline, o-nitroaniline, m-nitroaniline, p-nitroaniline, 2,4-dinitroaniline, 2,4,6-trinitroaniline, o-phenylenediamine, m-phenylenediamine, p-phenylenediamine, benzidine, p-aminobenzoic acid, sulfanilic acid, sulfanilamide, pyridine, 4-dimethylaminopyridine, piperidine, piperazine, 2-benzylimidazole, 4-phenylimidazole, 4-phenyl-4-methylimidazole, 4-undecylimidazoline, 2,4,5-trifuryl-2-imidazoline, 1,2-diphenyl-4,4-dimethyl-2-imidazoline, 2-phenyl-2-imidazoline, 1,2,3-triphenylguanidine, 1,2-ditolylguanidine, 1,2-dicyclohexylguanidine, 1,2,3-tricyclohexylguanidine, guanidine trichloroacetic acid, N,N'-dibenzylpiperazine, 4,4'-dithiomorpholine, morphonium trichroloacetate, 2-aminobenzothiazole, 2-benzoylhydrazinobenzotriazole, allylurea, thiourea, methylthiourea, allylthiourea, and ethylenethiourea.

The Schiff base is typically represented by the following formula (4):

formula (4)

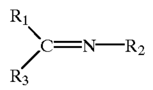

wherein $R_1$ and $R_2$ independently represent a hydrocarbon group (an alkyl group such as methyl, isopropyl, octyl, or heptadecyl, a cycloalkyl group such as cyclobutyl or cyclohexyl, an aryl group such as phenyl or naphthyl); and $R_3$ represents a hydrogen atom or the hydrocarbon group as denoted on $R_1$ and $R_2$ above.

The compound represented by the above formula can be synthesized by condensation of aldehydes or ketones with amines, for example, condensation of polyamines with monoaldehydes or monoketones, condensation of monoamines with polyaldehydes or polyketones, condensation of diamines with dialdehydes or diketones.

The examples of the monoamines include methylamine, propylamine, n-butylamine, n-amylamine, n-heptylamine, n-octylamine, n-nonylamine, n-decylamine, n-dodecylamine, n-tridecylamine, n-tetradecylamine, n-pentadecylamine, n-hexadecylamine, n-heptadecylamine, 1-methylbutylamine, octadecylamine, isopropylamine, tert-butylamine, sec-butylamine, tert-amylamine, isoamylamine, 1,3-dimethylbutylamine, 3,3-dimethylbutylamine, tert-octylamine, 1,2-dimethylbutylamine, 4-methylpentylamine, 1,2,2-trimethylpropylamine, 1,3-dimethylpentylamine, cyclobutylamine, cyclopentylamine, cyclohexylmethylamine, cyclohexylamine, aniline, o-toluidine, m-toluidine, p-toluidine, m-ethylaniline, p-ethylaniline, and p-butylaniline. The examples of the diamines include methylenediamine, ethylenediamine, 1,3-diaminopropane, 1,2-diaminopropane, 1,3-diamino-2-methylpropane, 2,5-dimethyl-2,5-hexanediamine, 1,4-diaminobutane, 1,5-diaminopentane, 1,4-hexanediamine, 1,7-diaminoheptane, 1,8-diaminooctane, 1,9-diaminononane, 1,10-diaminodecane, 1,11-diaminoundecane, 1,12-diaminododecane, 4,4'-methylenebiscyclohexaneamine, 1,2-diaminocyclohexane, 1,3-cyclohexanebismethylamine, benzidine, 4-aminophenyl ether, o-tolidine, 3,3'-dimethoxybenzidine, o-phenylenediamine, 4-methoxy-o-phenylenediamine, 2,6-diaminotoluene, m-phenylenediamine, p-phenylenediamine, 2,3-diaminonaphthalene, 1,5-diaminonaphthalene, and 1,8-diaminonaphthalene.

The examples of the monoaldehydes include formaldehyde, acetoaldehyde, propionaldehyde, butylaldehyde, isobutylaldehyde, 2-methylbutylaldehyde, 2-ethylbutylaldehyde, valeraldehyde, isovaleraldehyde, hexanal, 2-ethylhexanal, 2,3-dimethylvaleraldehyde, octylaldehyde, cyclohexanecarboxyaldehyde, cyclooctanecarboxyaldehyde, phenylacetoaldehyde, 2-phenylpropionaldehyde, diphenylacetoaldehyde, benzaldehyde, o-tolualdehyde, m-tolualdehyde, p-tolualdehyde, o-anisaldehyde, m-anisaldehyde, m-anisaldehyde, o-ethoxybenzaldehyde, p-ethoxybenzaldehyde, 2,4-dimethylbenzaldehyde, 2,5-dimethylbenzaldehyde, 4-biphenylcarboxyaldehyde, and 2-naphthoaldehyde. The examples of the dialdehydes include o-phthalaldehyde, isophthalaldehyde, and telephthalaldehyde. The examples of the monoketones include acetone, 2-butanone, 2-pentanone, 3-pentanone, 3-methyl-2-pentanone, 2-hexanone, 3-hexanone, 3-methylhexanone, 2-heptanone, 3-heptanone, 3-methylheptanone, 2-octanone, 3-octanone, 2-nonanone, cyclobutanone, cyclopenanone, phenylacetone, benzylacetone, 1-phenyl-2-butanone, 1,1-diphenylacetone, 1,3-diphenylacetone, 2-phenylcyclohexnone, β-tetralone, propiophenone, o-methylacetophenone, and benzophenone. The examples of the diketones include 2,4-pentanedione, 2,3-hexanedione, 2,5-hexanedione, 2,7-octanedione, 2,3-butanedione, 2-methyl-1,3-cyclopentanedione, 1,3-cyclohexanedione, 1,4-cyclohexanedione, 1,3-cyclopentanedione, 3-acetyl-2-heptanone, 2,2,6,6-tetramethyl-3,5-heptanedione, 2-methyl-1,3-cyclohexanedione, 5,5-dimethyl-1,3-cyclohexanedione, dibenzoylmethane, 1,4-dibenzoylbatane, p-diacetylbenzene, m-diacetylbenzene, benzyl, 4,4'-dimethoxybenzyl, 2-phenyl-1,3-indanedione, 1,3-indanedione, o-dibenzoylbenzene, 1,2-naphthoquinone, and 1,4-naphthoquinone.

The example of the Schiff base are listed below.

CF-1

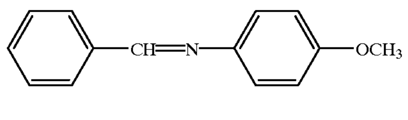

-continued

CF-2

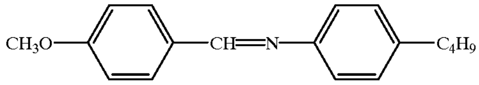

CF-3

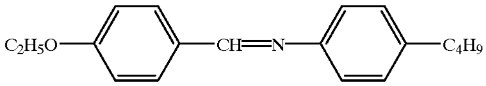

CF-4

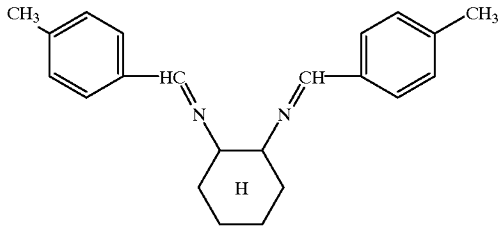

CF-5

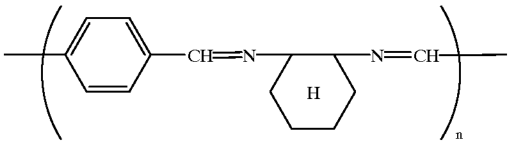

CF-6

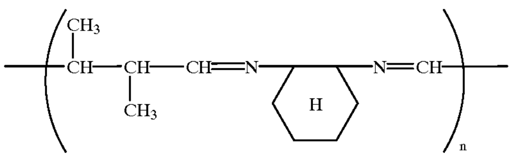

CF-7

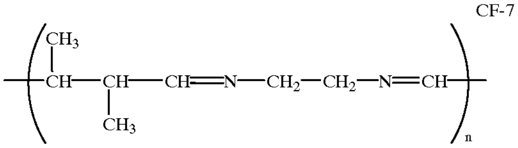

The basic compound can be used without any limitations, as long as it is a compound capable of trapping proton. The basic compounds may be used singly or in combination of two or more kinds. The basic compound content of the radiation sensitive layer is preferably 0.001 to 10 weight %, more preferably 0.01 to 5 weight % based on the total solid components.

The pH in the invention is measured employing a coating solution containing a solid content of 10% by weight, in which the light sensitive composition of the invention is dissolved in an organic solvent, water or a mixture thereof. The pH is measured with a digital pH meter, HM-30S produced by Toa denpa Kogyo Co., Ltd. by standardizing the pH meter, and perpendicularly immersing the pH measuring terminal in the coating solution for 2 minutes.

The support, on which the light sensitive layer is provides, includes a metal plate such as aluminum, zinc, steel or copper, a metal plate, paper sheet, plastic film or glass plate which is plated or vacuum evaporated with chromium, zinc, copper, nickel, aluminum or iron, a paper sheet coated with a resin, a paper sheet laminated with a metal foil such as aluminum and a plastic film subjected to hydrophilic treatment. Of these, an aluminum plate is preferable. When the invention is applied to a presensitized planographic printing plate, the support is preferably an aluminum plate which is subjected to a surface treatment such as graining treatment, anodizing treatment or sealing treatment. The surface treatment is carried out by a conventional method disclosed in Japanese Patent O.P.I. Publication Nos. 53-67507, 53-77702, 53-12320, 54-63902, 54-92804, 54-133903, 55-128494, 56-28893, 56-51388, 58-42493, 58-209597, 58-197090, 59-182967, 60-190392, 62-160291, 61-182950, 63-99992, 1-150583, 1-154797, 1-176594, 1-188699, 1-188395, 1-215591, 1-242289, 1-249494, 1-304993, 2-16090, 2-81692, 2-107490, 2-185493, 3-104694, 3-177528, 4-176690, 5-24376, 5-24377, 5-139067, and 6-247070.

The graining treatment includes a mechanically graining method and an electrolytically etching method. The mechanically graining method includes a ball graining method, a brush graining method, a liquid horning graining method and a buff graining method. The above methods can be used singly or in combination according to an aluminum material composition. The electrolytically etching is carried out in a bath containing one or more of phosphoric acid, sulfuric acid, hydrochloric acid and nitric acid. After graining, the surface of the support is optionally subjected to desmut treatment using an alkaline or acid solution to neutralize and washed with water.

The anodizing is carried out by electrolyzing the surface of the aluminum support using the aluminum plate as an anode in a solution containing one or more of sulfuric acid, chromic acid, oxalic acid, phosphoric acid and malonic acid. The thickness of the anodizing film formed is suitably 1 to 50 $mg/dm^2$, preferably 10 to 40 $mg/dm^2$, and more preferably 25 to 40 $mg/dm^2$. The thickness of the anodizing film is obtained by immersing the anodized aluminum in a solution containing phosphoric acid and chromic acid (water is added to 35 ml of 85% phosphoric acid and 20 g of chromium (IV) oxide to make a 1 liter solution) to dissolve the anodized film and measuring the aluminum weight before and after the immersing.

The sealing is carried out by treating the aluminum support with a boiling water, steam, a sodium silicate solution or a dichromic acid solution. The aluminum support can be subcoated with a water soluble polymer solution or a zirconium fluoride solution.

A backing layer (also called a back coat layer) containing metal oxides obtained by hydrolyzing or polycondensating organic or inorganic metal compounds is preferably provided on the surface of the support opposite the radiation sensitive layer whereby an anodized aluminum oxide dissolution in developer is minimized.

The coating amount of the backing layer may be any, as long as it prevents from dissolving the aluminum in the developer. The coating amount of the backing layer is preferably 0.001 to 10 $g/m^2$, more preferably 0.01 to 1 $g/m^2$, and still more preferably 0.02 to 0.1 $g/m^2$.

The backing layer can be coated on the surface of the support opposite the light sensitive layer according to various coating methods. In order to obtain the above described coating amount, the most preferable coating method is a method including preparing a backing layer coating solution, coating the solution on a support and drying.

The method of coating a radiation sensitive layer on a support includes conventional coating methods such as a whirler coating method, a wire-bar coating method, a dip coating method, an air-knife coating method, a blade coating method and a curtain coating method. The coating amount of the radiation sensitive layer in the presensitized planographic printing plate is preferably 0.5 to 5.0 $g/m^2$, although it varies depending on the usage.

The image forming material of the invention is preferably imagewise exposed to light having a wavelength of 400 nm or more, and preferably 700 nm or more. The light source emitting such a light includes a semiconductor laser, a He-Ne laser, a YAG laser, and a carbon dioxide laser. The output power is suitably 50 mW or more, and preferably 100 mW or more, per one laser beam.

(3) Image forming method

The image forming method in the invention comprises the steps of imagewise exposing or imagewise heating the radiation sensitive layer of the image forming material and then developing the resulting material with a developer to remove the radiation sensitive layer radiation at exposed or heated portions. Light for imagewise exposing is actinic light, preferably infrared laser as described above. In the invention, development is carried out employing a developer while a developer replenisher is replenished to the developer. In the invention, components of the radiation sensitive layer dissolved in the developer are decomposed compounds which do not affect developability of the developer, and therefore, the replenishing amount of developer replenisher can be greatly reduced compared to that of conventional development. This results in extension of developer life, extension of the period during which developer need not be replaced with fresh developer, and in a great increase of the amount of image forming material to be processed. The reduced replenishing amount of developer replenisher also reduces the amount of the developer waste, which is environmentally and sanitarily advantageous. The replenishing amount of developer replenisher in the invention is preferably 100 ml or less, more preferably 50 ml or less, and still more preferably 25 ml or less, per $m^2$ of image forming material. The above described replenishing amount is necessary to compensate for lowered developer activity caused by development of image forming material. After detecting lowering of developer activity for replenishment, developer is replenished with a predetermined amount of developer replenisher. The detecting method includes a method of measuring the processed area of image forming material, electric conductivity, pH or impedance of developer, or dissolution amount of radiation layer components in the developer, but any method can be used. Further, any time for replenishment is not limited, as long as development stability is secured. Since developer activity is lowered not only by development of image forming material but also by absorption of ambient carbon dioxide, replenishment is also carried out to counter the lowering of developer activity due to the carbon dioxide absorption. The replenishing amount defined in the invention does not include the replenishing amount carried out to counter the lowering of developer activity due to the carbon dioxide absorption. It is apparent that reduction in a replenishing amount of the developer replenisher replenished according to the processed amount of the image forming materials, and reduction in a replenishing amount of the developer replenisher replenished due to the carbon dioxide absorption bring about reduction of waste.

In the invention, preferable results are obtained if the amount of image forming materials to be continuously processed is 500 $m^2$ or more, more preferable results are obtained if the amount is 1000 $m^2$ or more, and most preferable results are obtained if the amount is 3000 $m^2$ or more.

The amount of image forming materials to be continuously processed herein referred to is represented by an area of image forming materials which have been continuously processed with a processing solution, which is replenished with a given amount of replenisher without being replaced by a fresh processing solution, under predetermined processing conditions (including replenishment carried out while the processor is switched on or off, or daily replenishment).

Developer or developer replenisher used in the invention is suitably an aqueous alkaline developer. The alkaline developer in the invention contains an alkali metal salt such as sodium hydroxide, potassium hydroxide, sodium carbonate, potassium carbonate, sodium metasilicate, potassium metasilicate or di or trisodium phosphate. The alkali metal salt concentration of the developer is preferably 0.05 to 20% by weight, and more preferably 0.1 to 10% by weight.

Developer or developer replenisher used in the invention preferably contains an alkali metal silicate. The developer or developer replenisher has a silicate concentration/alkali metal concentration ($SiO_2$ mol concentration/alkali metal mol concentration) ratio of preferably 0.15 to 1.0, and contains the alkali silicate in an amount of 0.5 to 5 weight %. It is especially preferable that the developer has a silicate concentration/alkali metal concentration ratio of 0.25 to 0.75, and contains the alkali silicate in an amount of 1.0 to 4.0 weight %, and that the developer replenisher has a silicate concentration/alkali metal concentration ratio of 0.15 to 0.5, and contains the alkali silicate in an amount of 1.0 to 3.0 weight %.

A non-silicate type developer disclosed in Japanese Patent O.P.I. Publication Nos. 8-305039 and 8-160631 can be used.

The developer optionally contains an anionic surfactant, a nonionic surfactant, a cationic surfactant, an amphoteric surfactant or an organic solvent.

The anionic surfactant includes a salt of a higer alcohol sulfate with 8–22 carbon atoms such as sodium laurylalcohol sulfate, sodium octylalcohol sulfate, ammonium laurylalcohol sulfate, sodium laurylalcohol sulfate, or sodium alkylsulfate, a salt of an aliphatic alcohol sulfate such as sodium acetylalcohol sulphate, an alkylarylsulfonic acid salt such as an alkylbenzene sulfonic acid salt, an alkylnaphthalene sulfonic acid salt, or sodium metanitrobenzene sulfonate, sodiumsulfoalkyl amide such as $C_{17}H_{33}CON(CH_3)CH_2CH_2SO_3Na$, and a sulfonic acid salt of a dibasic fatty acid ester such as dioctyl sodiumsulfo-succinate or dihexyl sodiumsulfo-succinate.

The nonionic surfactant includes those disclosed in Japanese Patent O.P.I. Publication Nos. 59-84241, 62-168160, and 62-175758. The cationic surfactant includes those disclosed in Japanese Patent O.P.I. Publication No. 62-175757. The amphoteric surfactant includes an alkylcarboxy betaine type, alkylaminocarboxylic acid type, alkylimidazoline type compound and an organic boron compound disclosed in Japanese Patent Publication No. 1-57895. The surfactant content of the working developer is preferably 0.1 to 5 weight %.

The organic solvent is suitably a solvent having a solubility in water of 10 weight % or less, and preferably 2 weight % or less. The organic solvent includes 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzylalcohol, m-methoxybenzylalcohol, p-methoxybenzylalcohol, benzylalcohol, cyclohexanol, 2-methyl cyclohexanol, 4-methylcyclohexanol, and 3-methyl cyclohexanol. In the invention, propylene glycol, ethylene glycol monophenylether, benzyl alcohol, or n-propylalcohol is preferable.

The organic solvent content of the working developer is preferably 0.1 to 5 weight %. The organic solvent content is closely related to the surfactant content, and it is preferred that as the organic solvent content is higher, the surfactant content is also higher.

The developer optionally contains an alkali soluble mercapto compound and/or a thioether compound, a water soluble reducing agent, an anti-foaming agent or a water softener.

The water softener includes polyphosphates such as $Na_2P_2O_7$, $Na_3P_1O_9$, $Na_2P_2O_7$, $Na_2O_1(NaO_3P)PO_3Na_2$, and calgon (sodium polymetaphosphate), aminopolycarboxylic acids or their salts such as ethylenediaminetetraacetic acid or its sodium or potassium salt, diethylenetriaminepentaacetic acid or its sodium or potassium salt, triethylenetetraminehexaacetic acid or its sodium or potassium salt, hydroxyethylethylenediaminetriacetic acid or its sodium or potassium salt, nitrilotriacetic acid or its sodium or potassium salt, 1,2-diaminocyclohexane-tetraacetic acid or its sodium or potassium salt, 1,3-diamino-2-propanoltetraacetic acid or its sodium or potassium salt, and an organic sulfonic acid salt such as ethylenediaminetetra(methylene sulfonic acid) or its sodium or potassium salt. The water softener content of the developer varies on hardness or amount of a hard water used, but the content is preferably 0.01 to 5 weight %, and more preferably 0.01 to 0.5 weight %.

The water soluble reducing agent includes a phenolic compound such as hydroquinone or methoxyquinone, an amine compound such as phenylamine or phenylhydrazine, a sulfite such as sodium sulfite, potassium sulfite or sodium bisulfite, a phosphite such as potassium phosphite, potassium hydrogen phosphite, sodium thiosulfate, and sodium dithionite. The water soluble reducing agent content of the developer is preferably 0.01 to 10 weight %.

The alkali soluble mercapto compound and/or thioether compound is preferably a compound having at least one mercapto group and/or at least one thioether group and at least one acid reidue in the molecule, and more preferably a compound having at least one mercapto group and at least one carboxyl group in the molecule. The examples thereof include mercaptoacetic acid, 2-mercaptopropionic acid, 3-mercaptopropionic acid, 4-mercaptobutanoic acid, 2,4-dimercaptobutanoic acid, 2-mercaptotetradecanoic acid, 2-mercaptomyristic acid, mercaptosuccinic acid, 2,3-dimercaptosuccinic acid, cysteine, N-acetylcysteine, N-(2-mercaptopropionyl)glycine, N-(2-mercapto-2-methylpropionyl)glycine, N-(3-mercaptopropionyl)glycine, N-(2-mercapto-2-methylpropionyl)cysteine, penicilamine, N-acetylpenicilamine, a glycine-cysteine-glutamine condensate, N-(2,3-dimercaptopropionyl)glycine, 2-mercaptonicotinic acid, thiosalicylic acid, 3-mercaptobenzoic acid, 4-mercaptobenzoic acid, 3-carboxy-4-mercaptopyridine, 2-mercaptobenzothiazole-5-carboxylic acid, 2-mercapto-3-phenylpropenic acid, 2-mercapto-5-carboxyethylimidazole, 5-mercapto-1-(4-carboxyphenyl)-tetrazole, N-(3,5-dicarboxyphenyl)-2-mercaptotetrazole, 2-(1,2-dicarboxyethylthio)-5-mercapto-1,3,4-thiadiazole, 2-(5-mercapto-1,3,4-thiadiazolylthio)hexanoic acid, 2-mercaptoethanesulfonic acid, 2,3-dimercapto-1-propanesulfonic acid, 2-mercaptobenzenesulfonic acid, 4-mercaptobenzenesulfonic acid, 3-mercapto-4-(2-sulfophenyl)-1,2,4-triazole, 2-mercaptobenzothiazole-5-sulfonic acid, 2-mercaptobenzimidazole-6-sulfonic acid, mercaptosuccinimide, 4-mercaptobenzenesulfonamide, 2-mercaptobenzimidazole-5-sulfonamide, 3-mercapto-4-(2-methylaminosulfonylethoxy)toluene, 3-mercapto-4-(2-methylaminosulfonylaminoethoxy)toluene, 4-mercapto-N-(p-methylphenylsulfonyl)benzamide, 4-mercaptophenol, 3-mercaptophenol, 3,4-dimercaptotoluene, 2-mercaptohydroquinone, 2-thiouracil, 3-hydroxy-2-mercaptopyridine, 4-hydroxythiophenol, 4-hydroxy-2-mercaptopyrimidine, 4,6-dihydroxy-2-mercaptopyrimidine, 2,3-dihydroxypropylmercaptane, tetraethylene glycol, 2-mercapto-4-octylphenylmethyl ether, 2-mercapto-4-octylphenol-methanesulfonylaminoethyl ether, 2-mercapto-4-octylphenylmethylaminosulfonylbutyl ether, thiodiglycolic acid, thiodiphenol, 6,8-dithiooctanoic acid, and an alkali metal, alkali earth metal or organic amine salt thereof. The content of the alkali soluble mercapto compound or thioether compound in the developer is preferably 0.01 to 5 weight %.

The composition of the developer replenisher may be the same as or different from that of the developer, but development activity (such as pH) of the developer replenisher is preferably higher than that of the developer.

When the developer replenisher is replenished to the developer, the developer replenisher may be either in a solid form or in a liquid form.

In the invention, a conventional gumming solution or rinsing solution can be used. The gumming solution preferably contains an acid or a buffering agent in order to remove the alkaline components contained in the developer. The gumming solution can further contain hydrophilic polymeric compounds, a chelating agent, a wetting agent, an antiseptic agent, or a dissolution auxiliary. When the gumming solution contains the hydrophilic polymeric compounds, the solution serves as a protective agent to prevent the printing plate obtained after processing from damage or stain.

The composition of the developer replenisher may be the same as or different from the developer, but activity of the developer replenisher is preferably higher than that of the developer. For example, pH, or alkali metal concentration of the developer replenisher is preferably higher.

A surfactant can be added to the gumming solution used in the invention in order to improve the coated surface. The surfactant includes an anionic surfactant and/or a nonionic surfactant. The anionic surfactant includes fatty acid salts, abietic acid salts, hydroxyalkane sulfonic acid salts, alkane sulfonic acid salts, dialkylsulfosuccinic acid salts, straight-chained alkylbenzene sulfonic acid salts, branched alkylbenzene sulfonic acid salts, alkylnaphthalene sulfonic acid salts, alkylphenoxypolyoxyethylenepropyl sulfonic acid salts, polyoxyethylenealkyl sulfophenylether salts, N-methyl-N-oleiltaurine sodium salts, N-alkylsulfosuccinic acid monoamide disodium salts, petroleum sulfonic acid salts, nitrated castor oil, sulfated beef tallow, fatty acid alkyl ester sulfate salts, alkylsulfate salts, polyoxyethylenealkylethersulfate salts, fatty acid monoglyceride sulfate salts, polyoxyethylenealkylphenylethersulfate salts, polyoxyethylenestyrylphenylethersulfate salts, alkylphosphate salts, polyoxyethylenealkyletherphosphate salts, polyoxyethylenealkylphenyletherphosphate salts, partial saponification products of styrene-maleic anhydride copolymers, partial saponification products of olefin-maleic anhydride copolymers, and condensates of naphthalene sulfonic acid salts with formalin. Of these, dialkylsulfosuccinic acid salts, alkylsulfate salts, or alkylnaphthalene sulfonic acid salts are preferable.

The nonionic surfactant includes polyoxyethylenealkyl ethers, polyoxyethylenealkylphenyl ethers, polyoxyethylenepolystyrylphenyl ethers, polyoxyethylenepolyoxypropylenalkyl ethers, partial esters of glycerin and fatty acids, partial esters of sorbitan and fatty acids, partial esters of pentaerythritol and fatty acids, propylene glycol monofatty acid ester, partial esters of sucrose and fatty acids, partial esters of polyoxyethylenesorbitan and fatty acids, partial esters of polyoxyethylenesorbitol and fatty acids, esters of polyoxyethylene glycol and fatty acids, partial esters of polyglycerin and fatty acids, polyoxyethylene castor oil, partial esters of polyoxyethyleneglycerin and fatty acids, fatty acid diethanolamides, N,N-bis-2-hydroxyalkylamines, polyoxyethylenealkylamines, triethanolamine fatty acid esters, and trialkylamine oxides. Of these, polyoxyethylenealkylphenyl ethers, or polyoxyethylene-polyoxypropylene block polymers are preferably used. Anionic or nonionic surfactants containing fluorine or silicon can be also used. These surfactants can be used in combination. For example, two or more of the anionic surfactants or a mixture of the anionic and cationic surfactant are preferably used. The surfactant content of the gumming solution is not limited, but is preferably 0.01 to 20 weight %.

The gumming solution used in the invention optionally contains polyhydric alcohol, alcohol or aliphatic hydrocarbons as a wetting agent.

The polyhydric alcohol is preferably ethylene glycol, diethylene glycol, triethylene glycol, propylene glycol, tetraethylene glycol, polyethylene glycol, glycerin, or sorbitol. The alcohol includes an alkyl alcohol such as propyl alcohol, butyl alcohol, pentanol, hexanol, heptanol or octanol, an alcohol containing an aromatic ring such as benzyl alcohol, phenoxyethanol, or phenylaminoethyl alcohol. The alcohol or polyhydric alcohol further includes n-hexanol, methylamyl alcohol, 2-ethylbutanol, n-heptanol, 3-heptanol, 2-octanol, 2-ethylhexanol, nonanol, 3,5,5-trimethylhexanol, n-decanol, undecanol, n-dodecanol, trimethylnonyl alcohol, tetradecanol, heptadecanol, 2-ethyl-1,3-hexanediol, 1,6-hexanediol, 2,5-hexanediol, 2,4-hexanediol, 1,8-octanediol, 1,9-nonanediol, and 1,10-decanediol. The wetting agent content of the gumming solution is 0.1 to 50 weight %, and preferably 0.5 to 3.0 weight %.

The gumming solution used in the invention optionally contains ethylene glycol, propylene glycol, triethylene glycol, butylene glycol, hexylene glycol, diethylene glycol, dipropylene glycol, glycerin, trimethylolpropane, or diglycerin. These wetting agent can be used alone or in combination. The content of the above wetting agent in the gumming solution is preferably 1 to 25 weight %.

The gumming solution can contain hydrophilic polymeric compounds in order to improve a film forming property.

Conventional hydrophilic polymeric compounds used in the gumming solution can be suitably used.

The hydrophilic polymeric compounds include gum arabic, a cellulose derivative (for example, carboxymethylcellulose, carboxyethylcellulose or methylcellulose) or its modified compounds, polyvinyl alcohol or its derivative, polyvinyl pyrrolidone, polyacrylamide or an acrylamide copolymer, vinylmethylether-maleic anhydride copolymer, vinylacetate-maleic anhydride copolymer, and styrene-maleic anhydride copolymer.

The gumming solution generally has an acidic pH range of 3 to 6. In order to obtain a pH of 3 to 6, inorganic acids, organic acids, or inorganic salts are added to the gumming solution. The addition amount thereof is preferably 0.01 to 2 weight %. The inorganic salts include nitric acid, sulfric acid, phosphoric acid and metaphosphoric acid.

The organic acids include citric acid, acetic acid, oxalic acid, malonic acid, p-toluenesulfonic acid, glutaric acid, malic acid, lactic acid, lebric acid, phytic acid, and organic phosphonic acid. The inorganic salts include magnesium nitrate, sodium primary phosphate, sodium secondary phosphate, nickel sulfate, sodium hexametaphosphate, and sodium tripolyphospate. The inorganic acids, organic acids, or inorganic salts can be used alone or as a mixture of two or more thereof.

The gumming solution used in the invention can further contain an antiseptic agent, or an antifoaming agent.

The examples of the antiseptic agent include phenol or its derivatives, formalin, imidazole derivatives, sodium dehydroacetate, derivatives of 4-isothiazoline-3-one, benzoisothiazoline-3-one, derivatives of benzotriazole, derivatives of amidine guanidine, quaternary ammonium salts, derivatives of pyridine, quinoline or guanidine, diazine, derivatives of triazole, oxazole, and derivatives of oxazine. The addition amount of the antiseptic agent in the gumming solution is an amount sufficient to prevent growth of mold, germs or yeast. The addition amount differs depending on kinds of mold, germs or yeast, but is preferably 0.01 to 4 weight % based on the gumming solution. Two or more of the antiseptic agent are preferably used in order to prevent growth of both mold and germs. The anti-foaming agent is preferably a silicone anti-foaming agent. The silicone anti-foaming agent may be of emulsion dispersion type or dissolution type. The addition amount of the anti-foaming agent is preferably 0.01 to 1.0 weight % based on the gumming solution.

The gumming solution used in the invention can further contain a chelating agent. The example of the chelating agent includes ethylenediaminetetraacetic acid or its sodium or potassium salt, diethylenetriaminepentaacetic acid or its sodium or potassium salt, triethylenetetraminehexaacetic acid or its sodium or potassium salt, hydroxyethylethylenediaminetriacetic acid or its sodium or potassium salt, nitriloacetic acid or its sodium salt, and an organic phosphonic acid or phosphonoalkane tricarboxylic acid such as 1-hydroxyethane-1,1-diphosphonic acid or its sodium or potassium salt, or aminotri(methylenephosphonic acid) or its sodium or potassium salt. Besides the above described chelating agents, organic amine salts can be used. Among the chelating agents, those which are stably present in the gumming solution and do not impair printing property are used. The addition amount of the chelating agent is preferably 0.01 to 1.0 weight % based on the gumming solution.

The gumming solution used in the invention can further contain a lipophilicity providing agent. The example thereof includes hydrocarbons such as turpentine oil, xylene, toluene, n-heptane, solvent naphtha, kerosene, mineral spirit, petroleum distilate having a boiling point of from 120° C. to 250° C.; diesters of phthalic acid such as dibutyl phthalate, diheptyl phthalate, di-n-octyl phthalate, di(2-ethylhexyl) phthalate, dinonyl phthalate, didecyl phthalate, dilauryl phthalate, or butylbenzyl phthalate; esters of aliphatic dibasic acid such as dioctyl adipate, butylglycol adipate, dioctyl azelate, dibutyl sebacate, di(2-ethylhexyl) sebacate, or dioctyl sebacate; epoxidation triglycerides such as epoxidation soybean oil; and plasticizers, having a solidifying point of 15° C. or less and a boiling point at 1 atm of 300° C. or more, including phosphates such as tricresyl phosphate, tricotyl phosphate or trischloroethyl phosphate, and benzoates such as benzyl benzoate.

The example thereof includes a saturated fatty acid such as caproic acid, enanthic acid, caprylic acid, pelagonic acid, capric acid, undecanoic acid, lauric acid, tridecanoic acid, myristic acid, pentadecanoic acid, palmitic acid, heptadecanoic acid, stearic acid, nonadecanoic acid, arachidic acid, behenic acid, lignoceric acid, cerotic acid, heptacosanoic acid, montanic acid, melissic acid, lacceric acid, or isovaleric acid, and an unsaturated fatty acid such as acrylic acid, chrotonic acid, isochrotonic acid, undecylenic acid, oleic acid, elaidic acid, cetoleic acid, sorbic acid, linoleic acid, linolenic acid, arachidonic acid, propiolic acid, stearolic acid, clupanodonic acid, tariric acid, or licanic acid. The preferable fatty acids are those which are liquid at 50° C. The fatty acids are those having preferably 5 to 25 carbon atoms, and more preferably 8 to 21 carbon atoms. The above lipophilicity providing agent can be used alone or as a mixture of two or more thereof. The addition amount of the lipophilicity providing agent is preferably 0.01 to 10 weight %, and more preferably 0.05 to 5 weight %, based on the gumming solution.

The lipophilicity providing agent may be dispersed in the emulsified gumming solution in the form of oil phase, or may be dissolved in the solution in the presence of a dissolution auxiliary.

The solid content of the gumming solution is preferably 5 to 30 g/liter. The developed material is washed with water, gummed (coated with a gumming solution), optionally rinsed, and dried. The coating amount of the gumming solution is preferably 1 to 10 g/m$^2$ of developed material. The coating amount of the gumming solution can be adjusted by a squeegeeing means of an automatic processor.

In the invention, the time from completion of gumming solution coating untill the beginning of drying is preferably 3 seconds or less, and more preferably 2 seconds or less. The shorter the time, the higher ink receptive property is.

The drying time is preferably 1 to 5 seconds. The drying means includes conventional heating means such as hot air heaters or infrared heaters. In the drying process, the solvent in the gumming solution is evaporated.

Sufficient temperature and output of the heater, which are necessary to dry, are required. The drying temperature differs depending on components used in the gumming solution. When the solvent used in the gumming solution is water, the drying temperature is preferably 55° C. or more. The output of the heater is more important than the drying temperature. When the heater is a hot air heater, the output is preferably 2.6 kW or more. The higher the output, the better, but the output is preferably 2.6 to 7 kW in view of cost performance.

In the processing method of the invention, an automatic processor disclosed in Japanese Patent O.P.I. Publication No. 5-188601 is preferably employed, and the developer, the erasing solution or other processing solutions disclosed in Japanese Patent O.P.I. Publication No. 9-134018 are preferably employed.

After imagewise exposure and before development, the exposed image forming material may be heated. The heating is preferably carried out at 80 to 200° C. for 5 to 20 seconds.

After development, the image forming material is preferably subjected to burning treatment at 150 to 200° C. for 20 to 200 seconds. This treatment results in a great increase of mechanical strength of the radiation sensitive layer and in high printing durability when used as a printing plate.

EXAMPLES

Next, the present invention will be explained in the examples, but is not limited thereto. In the examples, all "parts" are by weight, unless otherwise specified.

(Preparation of a Support)

A 0.24 mm thick aluminum plate (JIS-1050) was degreased at 85° C. for one minute in a 10% sodium hydroxide solution, washed with water. The resulting aluminum plate was dipped for 1 minute in a 10% sulfuric acid aqueous solution kept at 25° C. to desmut, and then washed with water. The resulting aluminum plate was electrolytically surface roughened in 1.0% nitric acid aqueous solution at 30° C. at a current density of 50 A/dm$^2$ to give quantity of electricity of 400 C/$dm^2$. The surface roughened plate was chemically etched in a 10% sodium hydroxide aqueous solution at 50° C. to give a dissolution amount of aluminum of 3 g/$m^2$, desmutted in a 10% nitric acid aqueous solution kept at 25° C. for 10 seconds, and then washed with water. The resulting plate was anodized for 1 minute in a 20% sulfuric acid aqueous solution at 35° C. at a current density of 2 A/$dm^2$, subjected to sealing treatment for 30 seconds in a 0.1% ammonium acetate aqueous solution kept at 80° C., and then dried for 5 minutes at 80° C. A 10 g/liter aqueous solution of sodium silicate (according to JIS No. 3) was coated on one surface of the above obtained plate using a wire bar, and dried for 3 minutes at 80° C. to give a backing layer having a dry thickness of 10.0 mg/$m^2$. Thus, an aluminum support was obtained.

Example 1

The following radiation sensitive composition was coated on the support prepared above, and dried at 100° C. for 2 minutes to obtain a radiation sensitive layer with a dry thickness of 2.0 g/$m^2$. Thus, a presensitized planographic printing plate 1 was prepared.

(Radiation Sensitive Composition)

| | |
|---|---|
| Binder A | 70 parts |
| Binder B | 5 parts |
| Acid decomposable compound A-1 | 20 parts |
| Acid generating compound (Exemplified compound S-5) | 3 parts |
| Infrared absorbent (Exemplified infrared absorbent IR-53) | 1 part |
| Crystal Violet | 0.3 parts |
| Surfactant S-381 (produced by Asahi Glass Co. Ltd.) | 0.5 parts |
| Methyl lactate | 700 parts |
| MEK (methyl ethyl ketone) | 200 parts |

Binder A: copolycondensate of phenol, m-cresol and p-cresol with formaldehyde (Mw = 4000, phenol/m-cresol/p-cresol = 5/57/38 by molar ratio)
Binder B: methylmethacrylate/hydroxyphenyl-methacrylamide/methacrylamide/methacrylonitrile copolymer (copolymerization ratio = 20/20/30/30 by weight ratio, Mw = 30000)

Presensitized planographic printing plate 1 was processed according to the following processing methods, and an image was formed.

The presensitized planographic printing plate 1 was imagewise exposed to semiconductor laser (light source, Trend Setter 3244 produced by Kreoproducts Co., Ltd., laser having 830 nm wavelength, output 10 W, 240 channel). The exposed plate was continuously processed employing an automatic processor 1 as shown in FIG. 1.

Automatic processor 1 in FIG. 1 will be explained below.

In FIG. 1, an exposed presensitized planographic printing plate is horizontally transported from inlet rollers 30 to outlet rollers 60 through a transport path P. A developer is supplied to the exposed presensitized planographic printing plate being transported from developer nozzles 31 connected to developing tank 11 with pipes (not illustrated), the developer being fed to the nozzle and circulated through pumps (not illustrated). Then, the developed plate is transported from developer squeegeeing rollers 38 to washing inlet blade 47. In the water washing section of the processor, in which washing nozzles 42 connect washing tanks 13, 14 and 15 through pipes (not illustrated), and the washing water is fed to the washing nozzles and circulated through pumps (not illustrated), the developer squeegeed plate is washed with water while transported from the washing inlet blade to washing outlet rollers 43. Then, the washed plate is transported from washing outlet rollers to gumming inlet rollers 51. In the gumming section in which a gumming solution nozzle 52 is connected to gumming solution tank 16 through a pipe (not illustrated) so that the gumming solution is fed to the nozzle 52 and circulated through a pump (not illustrated), the washed plate is transported for gumming solution coating from the gumming inlet rollers 51 to gumming solution coating rollers 53. Then, the gumming solution coated plate is transported to the drying section to obtain a planographic printing plate.

The developing tank 11 is charged with 25 liters of the developer described later, the washing tanks 13, 14 and 15 are charged with tap water, and the gumming solution tank 16 is charged with 5 liters of a gumming solution (SGW-3 produced by Konica Corporation).

(Continuous Processing Method 1)

The following developer 1 and developer replenisher 1 were employed. The developer tank was charged with 25 liters of the developer. Developing was carried out at 35° C. for 10 seconds, and 20 ml of developer replenisher 1 were replenished in the developer of the developer tank per 1 $m^2$ of exposed presenstized planographic printing plate having been processed. In addition, in order to compensate for lowered developer activity due to carbon dioxide absorption by the developer, additional developer replenisher 1 was replenished, wherein the replenishing amount (hereinafter referred to simply as the replenishing amount during operation) of the developer replenisher 1 replenished when the automatic processor was switched on was 15 ml/hour, and the replenishing amount (hereinafter referred to simply as the replenishing amount during standby) of developer replenisher 1 replenished when the automatic processor was switched off was 10 ml/hour.

(Composition of Developer 1)

| | |
|---|---|
| A potassium silicate | 100.0 parts |
| Potassium hydroxide | 24.5 parts |
| Caprylic acid | 0.2 parts |
| Maleic acid | 2.0 parts |
| EDTA | 0.3 parts |
| Water | 1840 parts |

(Composition of Developer Replenisher 1)

| | |
|---|---|
| A potassium silicate | 100.0 parts |
| Potassium hydroxide | 41.5 parts |
| Caprylic acid | 0.1 parts |
| Maleic acid | 1.0 parts |
| EDTA | 0.1 parts |
| Water | 537 parts |

(Continuous Processing Method 2)

Continuous Processing Method 2 was carried out in the same manner as in Continuous Processing Method 1, except that the following developer replenisher 2 was used instead of developer replenisher 1, 45 ml of developer replenisher 2 were replenished in the developer per 1 $m^2$ of exposed presenstized planographic printing plate having been processed, the replenishing amount during operation of the developer replenisher 2 was 34 ml/hour, and the replenishing amount during standby of the developer replenisher 2 was 23 ml/hour.

(Composition of Developer Replenisher 2)

| | |
|---|---|
| A potassium silicate | 100.0 parts |
| Potassium hydroxide | 32.0 parts |
| Caprylic acid | 0.16 parts |
| Maleic acid | 1.6 parts |
| EDTA | 0.2 parts |
| Water | 1260 parts |

(Continuous Processing Method 3)

Continuous Processing Method 3 was carried out in the same manner as in Continuous Processing Method 1, except that the following developer replenisher 3 was used instead of developer replenisher 1, 90 ml of developer replenisher 3 were replenished in the developer per 1 $m^2$ of the exposed presensitized planographic printing plate having been processed, the replenishing amount during operation of the developer replenisher 3 was 68 ml/hour, and the replenishing amount during standby of the developer replenisher 3 was 45 ml/hour.

(Composition of Developer Replenisher 3)

| | |
|---|---|
| A potassium silicate | 100.0 parts |
| Potassium hydroxide | 28.3 parts |
| Caprylic acid | 0.18 parts |
| Maleic acid | 1.8 parts |
| EDTA | 0.25 parts |
| Water | 1550 parts |

(Continuous Processing Method 4)

Continuous Processing Method 4 was carried out in the same manner as in Continuous Processing Method 1, except that the following developer replenisher 4 was used instead of developer replenisher 1, 150 ml of developer replenisher 4 were replenished in the developer per 1 $m^2$ of the exposed presensitized planographic printing plate having been processed, the replenishing amount during operation of the developer replenisher 4 was 113 ml/hour, and the replenishing amount during standby of the developer replenisher 4 was 75 ml/hour.

(Composition of Developer Replenisher 4)

| | |
|---|---|
| A potassium silicate | 100.0 parts |
| Potassium hydroxide | 27.0 parts |
| Caprylic acid | 0.19 parts |
| Maleic acid | 1.9 parts |
| EDTA | 0.27 parts |
| Water | 1670 parts |

In each continuous processing method, 5,000 $m^2$ of the presensitized planographic printing plate were continuously processed. Sensitivity, small dot reproduction (at a 2% dot area portion with a screen line number of 200), and sludge occurrence were evaluated.

Sensitivity was represented in terms of exposure energy ($mJ/cm^2$) necessary to remove a radiation sensitive layer at exposed portions (to form an image). Small dot reproduction and sludge occurrence were evaluated according to the following criteria:

(Small Dot Reproduction)

○: Small dots were reproduced.

Δ: Some of the small dots were removed.

X: Small dots were almost all removed.

(Sludge Occurrence)

○: No sludge occurrence was observed.

Δ: Slight stain occurrence was observed, but acceptable in practical use.

X: Stain markedly occurred, and the resulting material was not of commercial use.

The results of processing methods 1, 2, 3, and 4 are shown in Tables 1, 2, 3, and 4, respectively.

Presensitized planographic printing plates 2 through 22 were prepared in the same manner as Presensitized planographic printing plate 1, except that acid decomposable compounds as shown in the Tables 1, 2, 3, and 4 were used. Each plate was exposed and continuously processed in the same manner as above, and evaluated in the same manner as above.

The results according to Continuous Processing Methods 1, 2, 3, and 4 are shown in Tables 1, 2, 3, and 4, respectively. Table 1 shows the results of Continuous Processing Method 1, Table 2 the results of Continuous Processing Method 2, Table 3 the results of Continuous Processing Method 3, and Table 4 the results of Continuous Processing Method 4.

TABLE 1

| Plate No. | Acid decomposable compound | Sensitivity ($mj/cm^2$) at processing amount ($m^2$) 0 | 500 | 1000 | 3000 | 5000 | Small dot reproduction at processing amount ($m^2$) 0 | 500 | 1000 | 3000 | 5000 | Sludge occurrence at processing amount ($m^2$) 0 | 500 | 1000 | 3000 | 5000 | Remarks |
|---|---|---|---|---|---|---|---|---|---|---|---|---|---|---|---|---|---|
| 1 | A-1 | 150 | 150 | 150 | 150 | 150 | ○ | ○ | ○ | ○ | ○ | ○ | ○ | ○ | ○ | ○ | Inv. |
| 2 | A-2 | 150 | 150 | 150 | 150 | 150 | ○ | ○ | ○ | ○ | ○ | ○ | ○ | ○ | ○ | ○ | Inv. |
| 3 | A-3 | 200 | 200 | 200 | 200 | 200 | ○ | ○ | ○ | ○ | ○ | ○ | ○ | ○ | ○ | ○ | Inv. |
| 4 | A-4 | 250 | 250 | 250 | 250 | 250 | ○ | ○ | ○ | ○ | ○ | ○ | ○ | ○ | ○ | ○ | Inv. |
| 5 | A-5 | 200 | 200 | 200 | 200 | 200 | ○ | ○ | ○ | ○ | ○ | ○ | ○ | ○ | ○ | ○ | Inv. |
| 6 | A-6 | 170 | 160 | 150 | 140 | 140 | ○ | ○ | Δ | Δ | Δ | ○ | ○ | ○ | ○ | Δ | Inv. |
| 7 | A-7 | 160 | 160 | 150 | 150 | 150 | ○ | ○ | ○ | ○ | Δ | ○ | ○ | ○ | ○ | Δ | Inv. |
| 8 | A-8 | 150 | 140 | 140 | 140 | 140 | ○ | ○ | Δ | Δ | X | ○ | ○ | ○ | Δ | X | Inv. |
| 9 | A-9 | 150 | 140 | 130 | 120 | 120 | ○ | ○ | Δ | Δ | Δ | ○ | ○ | ○ | ○ | ○ | Inv. |
| 10 | A-10 | 250 | 220 | 200 | 180 | 180 | ○ | ○ | ○ | Δ | X | ○ | ○ | ○ | Δ | X | Inv. |
| 11 | A-11 | 200 | 190 | 180 | 180 | 180 | ○ | ○ | ○ | ○ | Δ | ○ | ○ | ○ | ○ | Δ | Inv. |
| 12 | A-12 | 150 | 150 | 150 | 150 | 140 | ○ | ○ | ○ | ○ | ○ | ○ | ○ | ○ | ○ | ○ | Inv. |
| 13 | A-13 | 400 | 300 | 200 | 180 | 180 | ○ | X | X | X | X | ○ | Δ | X | X | X | Comp. |
| 14 | A-14 | 300 | 250 | 220 | 200 | 100 | ○ | Δ | X | X | X | ○ | Δ | X | X | X | Comp. |
| 15 | A-15 | 150 | 120 | 100 | 100 | 200 | ○ | X | X | X | X | ○ | Δ | X | X | X | Comp. |
| 16 | S-1 | 200 | 200 | 200 | 200 | 200 | ○ | ○ | ○ | ○ | ○ | ○ | ○ | ○ | ○ | ○ | Inv. |
| 17 | S-2 | 250 | 230 | 220 | 200 | 200 | ○ | ○ | ○ | Δ | X | ○ | ○ | ○ | Δ | X | Inv. |
| 18 | S-3 | 220 | 210 | 210 | 200 | 200 | ○ | ○ | ○ | ○ | Δ | ○ | ○ | ○ | ○ | Δ | Inv. |

TABLE 1-continued

| Plate | Acid decom-posable | Sensitivity (mj/cm$^2$) at processing amount (m$^2$) | | | | | Small dot reproduction at processing amount (m$^2$) | | | | | Sludge occurrence at processing amount (m$^2$) | | | | | Re- |
|---|---|---|---|---|---|---|---|---|---|---|---|---|---|---|---|---|---|
| No. | compound | 0 | 500 | 1000 | 3000 | 5000 | 0 | 500 | 1000 | 3000 | 5000 | 0 | 500 | 1000 | 3000 | 5000 | marks |
| 19 | S-4 | 420 | 320 | 250 | 200 | 200 | ○ | X | X | X | X | ○ | X | X | X | X | Comp. |
| 20 | S-5 | 350 | 300 | 250 | 200 | 200 | ○ | Δ | X | X | X | ○ | Δ | X | X | X | Comp. |
| 21 | S-6 | 170 | 170 | 170 | 170 | 170 | ○ | ○ | ○ | ○ | ○ | ○ | ○ | ○ | Δ | ○ | Inv. |
| 22 | S-7 | 250 | 240 | 240 | 240 | 240 | ○ | ○ | ○ | Δ | Δ | ○ | ○ | ○ | Δ | Δ | Inv. |

Inv.: Invention, Comp.: Comparative

TABLE 2

| Plate | Acid decom-posable | Sensitivity (mj/cm$^2$) at processing amount (m$^2$) | | | | | Small dot reproduction at processing amount (m$^2$) | | | | | Sludge occurrence at processing amount (m$^2$) | | | | | Re- |
|---|---|---|---|---|---|---|---|---|---|---|---|---|---|---|---|---|---|
| No. | compound | 0 | 500 | 1000 | 3000 | 5000 | 0 | 500 | 1000 | 3000 | 5000 | 0 | 500 | 1000 | 3000 | 5000 | marks |
| 1 | A-1 | 150 | 150 | 150 | 150 | 150 | ○ | ○ | ○ | ○ | ○ | ○ | ○ | ○ | ○ | ○ | Inv. |
| 2 | A-2 | 150 | 150 | 150 | 150 | 150 | ○ | ○ | ○ | ○ | ○ | ○ | ○ | ○ | ○ | ○ | Inv. |
| 3 | A-3 | 200 | 200 | 200 | 200 | 200 | ○ | ○ | ○ | ○ | ○ | ○ | ○ | ○ | ○ | ○ | Inv. |
| 4 | A-4 | 250 | 250 | 250 | 250 | 250 | ○ | ○ | ○ | ○ | ○ | ○ | ○ | ○ | ○ | ○ | Inv. |
| 5 | A-5 | 200 | 200 | 200 | 200 | 200 | ○ | ○ | ○ | ○ | ○ | ○ | ○ | ○ | ○ | ○ | Inv. |
| 6 | A-6 | 170 | 160 | 160 | 150 | 150 | ○ | ○ | ○ | Δ | Δ | ○ | ○ | ○ | ○ | Δ | Inv. |
| 7 | A-7 | 160 | 160 | 160 | 160 | 150 | ○ | ○ | ○ | ○ | Δ | ○ | ○ | ○ | ○ | Δ | Inv. |
| 8 | A-8 | 150 | 150 | 150 | 150 | 140 | ○ | ○ | ○ | Δ | Δ | ○ | ○ | ○ | Δ | Δ | Inv. |
| 9 | A-9 | 150 | 140 | 140 | 130 | 130 | ○ | ○ | ○ | Δ | Δ | ○ | ○ | ○ | ○ | ○ | Inv. |
| 10 | A-10 | 250 | 240 | 230 | 220 | 220 | ○ | ○ | ○ | ○ | Δ | ○ | ○ | ○ | ○ | Δ | Inv. |
| 11 | A-11 | 200 | 195 | 195 | 190 | 190 | ○ | ○ | ○ | ○ | ○ | ○ | ○ | ○ | ○ | ○ | Inv. |
| 12 | A-12 | 150 | 150 | 150 | 150 | 150 | ○ | ○ | ○ | ○ | ○ | ○ | ○ | ○ | ○ | ○ | Inv. |
| 13 | A-13 | 400 | 360 | 350 | 330 | 300 | ○ | Δ | X | X | X | ○ | Δ | X | X | X | Comp. |
| 14 | A-14 | 300 | 280 | 270 | 260 | 250 | ○ | ○ | Δ | Δ | X | ○ | Δ | Δ | X | X | Comp. |
| 15 | A-15 | 150 | 140 | 130 | 120 | 120 | ○ | Δ | X | X | X | ○ | Δ | Δ | X | X | Comp. |
| 16 | S-1 | 200 | 200 | 200 | 200 | 200 | ○ | ○ | ○ | ○ | ○ | ○ | ○ | ○ | ○ | ○ | Inv. |
| 17 | S-2 | 250 | 245 | 240 | 230 | 230 | ○ | ○ | ○ | ○ | Δ | ○ | ○ | ○ | ○ | Δ | Inv. |
| 18 | S-3 | 220 | 215 | 210 | 210 | 210 | ○ | ○ | ○ | ○ | ○ | ○ | ○ | ○ | ○ | ○ | Inv. |
| 19 | S-4 | 420 | 400 | 350 | 320 | 300 | ○ | Δ | X | X | X | ○ | Δ | X | X | X | Comp. |
| 20 | S-5 | 350 | 300 | 280 | 260 | 250 | ○ | ○ | Δ | X | X | ○ | ○ | Δ | X | X | Comp. |
| 21 | S-6 | 170 | 170 | 170 | 170 | 170 | ○ | ○ | ○ | ○ | ○ | ○ | ○ | ○ | ○ | ○ | Inv. |
| 22 | S-7 | 250 | 250 | 250 | 240 | 240 | ○ | ○ | ○ | ○ | Δ | ○ | ○ | ○ | ○ | Δ | Inv. |

Inv.: Invention, Comp.: Comparative

TABLE 3

| Plate | Acid decom-posable | Sensitivity (mj/cm$^2$) at processing amount (m$^2$) | | | | | Small dot reproduction at processing amount (m$^2$) | | | | | Sludge occurrence at processing amount (m$^2$) | | | | | Re- |
|---|---|---|---|---|---|---|---|---|---|---|---|---|---|---|---|---|---|
| No. | compound | 0 | 500 | 1000 | 3000 | 5000 | 0 | 500 | 1000 | 3000 | 5000 | 0 | 500 | 1000 | 3000 | 5000 | marks |
| 1 | A-1 | 150 | 150 | 150 | 150 | 150 | ○ | ○ | ○ | ○ | ○ | ○ | ○ | ○ | ○ | ○ | Inv. |
| 2 | A-2 | 150 | 150 | 150 | 150 | 150 | ○ | ○ | ○ | ○ | ○ | ○ | ○ | ○ | ○ | ○ | Inv. |
| 3 | A-3 | 200 | 200 | 200 | 200 | 200 | ○ | ○ | ○ | ○ | ○ | ○ | ○ | ○ | ○ | ○ | Inv |
| 4 | A-4 | 250 | 250 | 250 | 250 | 250 | ○ | ○ | ○ | ○ | ○ | ○ | ○ | ○ | ○ | ○ | Inv. |
| 5 | A-5 | 200 | 200 | 200 | 200 | 200 | ○ | ○ | ○ | ○ | ○ | ○ | ○ | ○ | ○ | ○ | Inv. |
| 6 | A-6 | 170 | 165 | 165 | 160 | 160 | ○ | ○ | ○ | ○ | Δ | ○ | ○ | ○ | ○ | ○ | Inv. |
| 7 | A-7 | 160 | 160 | 160 | 160 | 160 | ○ | ○ | ○ | ○ | ○ | ○ | ○ | ○ | ○ | ○ | Inv. |
| 8 | A-8 | 150 | 150 | 150 | 150 | 150 | ○ | ○ | ○ | ○ | Δ | ○ | ○ | ○ | Δ | Δ | Inv. |
| 9 | A-9 | 150 | 145 | 145 | 140 | 140 | ○ | ○ | ○ | ○ | Δ | ○ | ○ | ○ | ○ | ○ | Inv. |
| 10 | A-10 | 250 | 245 | 245 | 240 | 240 | ○ | ○ | ○ | ○ | ○ | ○ | ○ | ○ | ○ | ○ | Inv. |
| 11 | A-11 | 200 | 200 | 200 | 195 | 195 | ○ | ○ | ○ | ○ | ○ | ○ | ○ | ○ | ○ | ○ | Inv. |
| 12 | A-12 | 150 | 150 | 150 | 150 | 150 | ○ | ○ | ○ | ○ | ○ | ○ | ○ | ○ | ○ | ○ | Inv. |
| 13 | A-13 | 400 | 380 | 360 | 350 | 350 | ○ | ○ | Δ | Δ | X | ○ | ○ | Δ | Δ | X | Comp. |
| 14 | A-14 | 300 | 290 | 280 | 270 | 270 | ○ | ○ | Δ | Δ | Δ | ○ | ○ | Δ | Δ | X | Comp. |
| 15 | A-15 | 150 | 145 | 140 | 130 | 130 | ○ | ○ | Δ | X | X | ○ | ○ | Δ | Δ | X | Comp. |
| 16 | S-1 | 200 | 200 | 200 | 200 | 200 | ○ | ○ | ○ | ○ | ○ | ○ | ○ | ○ | ○ | ○ | Inv. |

TABLE 3-continued

| Plate No. | Acid decomposable compound | Sensitivity (mj/cm$^2$) at processing amount (m$^2$) | | | | | Small dot reproduction at processing amount (m$^2$) | | | | | Sludge occurrence at processing amount (m$^2$) | | | | | Remarks |
|---|---|---|---|---|---|---|---|---|---|---|---|---|---|---|---|---|---|
| | | 0 | 500 | 1000 | 3000 | 5000 | 0 | 500 | 1000 | 3000 | 5000 | 0 | 500 | 1000 | 3000 | 5000 | |
| 17 | S-2 | 250 | 245 | 245 | 240 | 240 | ○ | ○ | ○ | ○ | ○ | ○ | ○ | ○ | ○ | ○ | Inv. |
| 18 | S-3 | 220 | 220 | 220 | 220 | 220 | ○ | ○ | ○ | ○ | ○ | ○ | ○ | ○ | ○ | ○ | Inv. |
| 19 | S-4 | 420 | 400 | 400 | 380 | 380 | ○ | ○ | Δ | Δ | X | ○ | ○ | Δ | Δ | X | Comp. |
| 20 | S-5 | 350 | 330 | 320 | 300 | 300 | ○ | ○ | Δ | Δ | Δ | ○ | ○ | Δ | Δ | Δ | Comp. |
| 21 | S-6 | 170 | 170 | 170 | 170 | 170 | ○ | ○ | ○ | ○ | ○ | ○ | ○ | ○ | ○ | ○ | Inv. |
| 22 | S-7 | 250 | 250 | 250 | 250 | 250 | ○ | ○ | ○ | ○ | ○ | ○ | ○ | ○ | ○ | ○ | Inv. |

Inv.: Invention, Comp.: Comparative

TABLE 4

| Plate No. | Acid decomposable compound | Sensitivity (mj/cm$^2$) at processing amount (m$^2$) | | | | | Small dot reproduction at processing amount (m$^2$) | | | | | Sludge occurrence at processing amount (m$^2$) | | | | | Remarks |
|---|---|---|---|---|---|---|---|---|---|---|---|---|---|---|---|---|---|
| | | 0 | 500 | 1000 | 3000 | 5000 | 0 | 500 | 1000 | 3000 | 5000 | 0 | 500 | 1000 | 3000 | 5000 | |
| 1 | A-1 | 150 | 150 | 150 | 150 | 150 | ○ | ○ | ○ | ○ | ○ | ○ | ○ | ○ | ○ | ○ | Inv. |
| 2 | A-2 | 150 | 150 | 150 | 150 | 150 | ○ | ○ | ○ | ○ | ○ | ○ | ○ | ○ | ○ | ○ | Inv. |
| 3 | A-3 | 200 | 200 | 200 | 200 | 200 | ○ | ○ | ○ | ○ | ○ | ○ | ○ | ○ | ○ | ○ | Inv. |
| 4 | A-4 | 250 | 250 | 250 | 250 | 250 | ○ | ○ | ○ | ○ | ○ | ○ | ○ | ○ | ○ | ○ | Inv. |
| 5 | A-5 | 200 | 200 | 200 | 200 | 200 | ○ | ○ | ○ | ○ | ○ | ○ | ○ | ○ | ○ | ○ | Inv. |
| 6 | A-6 | 170 | 170 | 170 | 170 | 170 | ○ | ○ | ○ | ○ | ○ | ○ | ○ | ○ | ○ | ○ | Inv. |
| 7 | A-7 | 160 | 160 | 160 | 160 | 160 | ○ | ○ | ○ | ○ | ○ | ○ | ○ | ○ | ○ | ○ | Inv. |
| 8 | A-8 | 150 | 150 | 150 | 150 | 150 | ○ | ○ | ○ | ○ | ○ | ○ | ○ | ○ | ○ | ○ | Inv. |
| 9 | A-9 | 150 | 150 | 150 | 150 | 150 | ○ | ○ | ○ | ○ | ○ | ○ | ○ | ○ | ○ | ○ | Inv. |
| 10 | A-10 | 250 | 250 | 250 | 250 | 230 | ○ | ○ | ○ | ○ | ○ | Δ | ○ | ○ | ○ | Δ | Inv. |
| 11 | A-11 | 200 | 200 | 200 | 200 | 200 | ○ | ○ | ○ | ○ | ○ | ○ | ○ | ○ | ○ | Inv. | |
| 12 | A-12 | 150 | 150 | 150 | 150 | 150 | ○ | ○ | ○ | ○ | ○ | ○ | ○ | ○ | ○ | ○ | Inv. |
| 13 | A-13 | 400 | 380 | 380 | 370 | 350 | ○ | ○ | ○ | ○ | Δ | ○ | ○ | ○ | ○ | Δ | Comp. |
| 14 | A-14 | 300 | 300 | 300 | 290 | 280 | ○ | ○ | ○ | ○ | Δ | ○ | ○ | ○ | ○ | Δ | Comp. |
| 15 | A-15 | 150 | 140 | 140 | 130 | 130 | ○ | Δ | Δ | Δ | X | ○ | ○ | Δ | Δ | X | Comp. |
| 16 | S-1 | 200 | 200 | 200 | 200 | 200 | ○ | ○ | ○ | ○ | ○ | ○ | ○ | ○ | ○ | ○ | Inv. |
| 17 | S-2 | 250 | 250 | 250 | 250 | 250 | ○ | ○ | ○ | ○ | ○ | ○ | ○ | ○ | ○ | ○ | Inv. |
| 18 | S-3 | 220 | 220 | 220 | 220 | 220 | ○ | ○ | ○ | ○ | ○ | ○ | ○ | ○ | ○ | ○ | Inv. |
| 19 | S-4 | 420 | 400 | 390 | 370 | 360 | ○ | ○ | ○ | ○ | Δ | ○ | ○ | ○ | ○ | Δ | Comp. |
| 20 | S-5 | 350 | 340 | 340 | 330 | 330 | ○ | ○ | ○ | ○ | Δ | ○ | ○ | ○ | ○ | Δ | Comp. |
| 21 | S-6 | 170 | 170 | 170 | 170 | 170 | ○ | ○ | ○ | ○ | ○ | ○ | ○ | ○ | ○ | ○ | Inv. |
| 22 | S-7 | 250 | 250 | 250 | 250 | 250 | ○ | ○ | ○ | ○ | ○ | ○ | ○ | ○ | ○ | ○ | Inv. |

Inv.: Invention, Comp.: Comparative

As is apparent from Tables 1 through 4, the image forming methods of the invention (Examples 1 through 12, Examples 16 through 18, and Examples 21 and 22), comprising continuously processing the image forming material containing the specific acid decomposable compound in the invention, provided excellent sensitivity and excellent resolving power (good small dot reproduction), and prevented sludge occurrence, even in a continuous processing method in which the replenishing amount of developer replenisher was reduced. Particularly in Continuous Processing Method 1 in which the replenishing amount of developer replenisher was reduced to 20 ml/m$^2$, the good results were obtained even when a large amount of presensitized planographic printing plates were processed.

Example 2

The following radiation sensitive composition was coated on the support prepared above, and dried at 100° C. for 2 minutes to obtain a radiation sensitive layer with a dry thickness of 2.0 g/m$^2$. Thus, a presensitized planographic printing plate 1 was prepared.

(Radiation Sensitive Composition, Positive Working Type)

| | |
|---|---|
| Binder A | 70 parts |
| Binder B | 5 parts |
| Acid decomposable compound A-2 | 20 parts |
| Acid generating compound (Exemplified compound S-1) | 3 parts |
| Infrared absorbent (Exemplified infrared absorbent IR-53) | 1 part |
| Crystal Violet | 0.3 parts |
| Fluorine-containing surfactant S-381 (produced by Asahi Glass Co. Ltd.) | 0.5 parts |
| Methyl lactate | 700 parts |
| MEK (methyl ethyl ketone) | 200 parts |

Binder A: copolycondensate of phenol, m-cresol and p-cresol with formaldehyde (Mw = 4000, phenol/m-cresol/p-cresol = 5/57/38 by molar ratio)
Binder B: methylmethacrylate/hydroxyphenyl-methacrylamide/methacrylamide/methacrylonitrile copolymer (copolymerization ratio = 20/20/30/30 by weight ratio, Mw = 30000)

An image was formed using the presensitized planographic printing plate 1 according to the following processing method.

The presensitized planographic printing plate 1 was imagewise exposed to semiconductor laser (light source, Trend Setter 3244 produced by Kreoproducts Co., Ltd., laser having 830 nm wavelength, output 10 W, 240 channel). The exposed plate was developed and washed, employing an automatic processor PSZ-910 produced by Konica Corporation.

A developer used in the processing had the following composition.

The developer tank in the automatic processor was charged with 25 liters of the developer. Developing was carried out at 32° C. for 12 seconds.

(Composition of Developer 1)

| | |
|---|---|
| A potassium silicate | 100.0 parts |
| Potassium hydroxide | 24.5 parts |
| Caprylic acid | 0.2 parts |
| Maleic acid | 2.0 parts |
| EDTA | 0.3 parts |
| Water | 1840 parts |

The above obtained presensitized planographic printing plate 1 was evaluated for sensitivity, storage stability, and safelight safety property according to the following methods:

(Sensitivity)

Sensitivity was represented in terms of exposure energy ($mJ/cm^2$) necessary to remove a radiation sensitive layer at exposed portions.

(Storage Stability)

Storage stability was represented in terms of exposure energy ($mJ/cm^2$) necessary to remove a radiation sensitive layer at exposed portions in the presensitized planographic printing plate 1 having been stored for three days at 50° C. and 80% RH.

(Safelight Safety Property)

Presensitized planographic printing plate 1 was exposed to white fluorescent lamp at 1,000 LUX, and then developed. A remaining rate (weight ratio of radiation sensitive layer weight after development to radiation sensitive layer weight before development) of the radiation sensitive layer at image portions of the developed plate was measured. Safelight safety property was evaluated in terms of exposure time to give a remaining rate of less than 100%.

Presensitized planographic printing plates 2 through 9 were prepared in the same manner as in Presensitized planographic printing plate 1, except that acid generating compounds were used instead of acid generating compound, Exemplified compound S-1. The resulting plates were evaluated in the same manner as in Presensitized planographic printing plate 1. The results are shown in Table 5.

TABLE 5

| Plate No. | Acid decomposable composed Kinds | ε | λmax | Sensitivity ($mJ/cm^2$) | Storage stability ($mJ/cm^2$) | Safelight safety property | Remarks |
|---|---|---|---|---|---|---|---|
| 1 | S-1 | 1920 | 219 nm | 300 | 270 | More than 5 hours | Invention |
| 2 | S-2 | 6585 | 220 nm | 250 | 220 | More than 5 hours | Invention |
| 3 | S-3 | 23210 | 282 nm | 170 | 160 | More than 5 hours | Invention |
| 4 | S-4 | 23760 | 292 nm | 150 | 140 | More than 5 hours | Invention |
| 5 | S-5 | 22580 | 328 nm | 150 | 150 | More than 5 hours | Invention |
| 6 | S-6 | 17309 | 356 nm | 170 | 170 | More than 5 hours | inventibn |
| 7 | S-8 | 15400 | 245 nm | 170 | 160 | More than 5 hours | Invention |
| 8 | S-12 | 21200 | 238 nm | 150 | 145 | More than 5 hours | Invention |
| 9 | S-14 | 19400 | 233 nm | 300 | 240 | More than 5 hours | Invention |

As is apparent from Table 5, the presensitized planographic printing plates 1 through 9 of the invention, each comprising an acid generating compound which does not have an absorption band in the wavelength region of 400 nm or more, provided excellent sensitivity, excellent safelight safety property, and excellent storage stability showing reduced sensitivity fluctuation. Further, in the above image forming processings, there were no problems regarding sensitivity, small dot reproduction, and sludge occurrence.

Example 3

Presensitized planographic printing plate 11 through 19 were prepared in the same manner as in Presensitized planographic printing plate 1 of Example 2, except that acid generating compounds as shown in Table 6 were used, and hexamethoxymethylolmelamine (negative working type) was used instead of an acid decomposable compound A-2. The resulting plates were exposed, developed, and washed in the same manner as in Presensitized planographic printing plate 1 of Example 2, except that they were subjected to heat treatment at 140° C. for 30 seconds between the exposure and development. In this case, the radiation sensitive layer at non-exposed portions was removed by development.

The resulting presensitized planographic printing plates were evaluated for sensitivity, storage stability, and safelight safety property according to the following methods:

Evaluation (Sensitivity)

Sensitivity was represented in terms of exposure energy ($mJ/cm^2$) necessary to remove a radiation sensitive layer at unexposed portions.

(Storage Stability)

Storage stability was represented in terms of stain occurrence on printing plates developed after the presensitized planographic printing plates were stored for three days at 50° C. and 80% RH.

○: No stain occurrence was observed.

Δ: Slight stain occurrence was observed.

X: Stain markedly occurred.

(Safelight Safety Property)

Each presensitized planographic printing plate was exposed to white fluorescent lamp at 1,000 LUX, and then developed. Safelight safety property was represented in terms of exposure time when stain occurred on the developed plate.

The results are shown in Table 6.

TABLE 6

| Plate No. | Acid decomposable compound Kinds | ε | λmax | Sensitivity (mJ/cm$^2$) | Storage stability | Safelight safety property |
|---|---|---|---|---|---|---|
| 11 | S-1 | 1920 | 219 nm | 300 | ○ | More than 5 hours |
| 12 | S-2 | 6585 | 220 nm | 250 | ○ | More than 5 hours |
| 13 | S-3 | 23210 | 282 nm | 160 | ○ | More than 5 hours |
| 14 | S-4 | 23760 | 292 nm | 150 | ○ | More than 5 hours |
| 15 | S-5 | 22580 | 328 nm | 150 | ○ | More than 5 hours |
| 16 | S-6 | 17309 | 356 nm | 150 | ○ | More than 5 hours |
| 17 | S-8 | 15400 | 245 nm | 160 | ○ | More than 5 hours |
| 18 | S-12 | 21200 | 238 nm | 160 | ○ | More than 5 hours |
| 19 | S-14 | 19400 | 233 nm | 200 | ○ | More than 5 hours |

As is apparent from Table 6, the presensitized planographic printing plates 11 through 19 of the invention, each comprising an acid generating compound which does not have an absorption band in the wavelength region of 400 nm or more, provided excellent sensitivity, excellent safelight safety property, and excellent storage stability showing reduced sensitivity fluctuation.

EFFECTS OF THE INVENTION

The image forming method according to the present invention, comprising processing an image forming material containing a specific acid decomposable compound, exhibits excellent effects in that an image of excellent resolving power is formed with excellent sensitivity, the amount of the material to be processed is increased, and running processing stabilization comprising minimized sludge occurrence, and increased stabilization of developability is realized, even in a continuous processing method in which the replenishing amount of developer replenisher is reduced. Further, the present invention results in reduced amount of waste (including a developer waste). Furthermore, the present invention provides an image forming method capable of forming an image of high resolving power with high sensitivity in a process comprising imagewise infrared laser exposure, which is applied to CTP.

Further, the image forming material, which comprises an acid generating compound which does not have an absorption band in the wavelength region of 400 nm or more, provides excellent sensitivity, excellent storage stability, and easy handling property in use under room light, in an image forming process comprising infrared laser exposure in CTP.

Disclosed embodiment can be varied by a skilled person without departing from the spirit and scope of the invention.

What is claimed is:

1. An image forming method comprising:

a) imagewise heating, or imagewise exposing, an image forming material to a laser with a wavelength of 700 to 1200 nm; and b) developing the exposed or heated material with a developer, wherein the image forming material comprises a support and provided thereon, a radiation sensitive layer containing a dye having an absorption band in the wavelength region of from 700 nm to 1200 nm, an acid generating compound capable of generating an acid on irradiation of heat or actinic light, and an acid decomposable compound having a bond capable of being decomposed by an acid, the acid decomposable compound being decomposed by an acid to produce a diol compound containing an ethylene glycol component or a propylene glycol component, and wherein the dye is a cyanine dye represented by formula (2or (3):

formula (2)

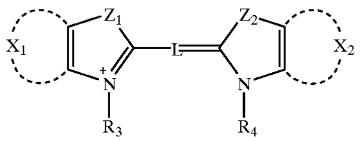

formula (3)

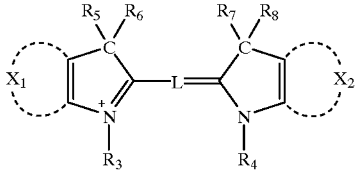

wherein $Z_1$ and $Z_2$ independently represent a sulfur atom, a selenium atom or an oxygen atom; $X_1$ and $X_2$ independently represent a non-metallic atomic group necessary to form a benzene or naphthalene ring, which may have a substituent; $R_3$ and $R_4$ independently represent a substituent; $R_5$, $R_6$, $R_7$ and $R_8$ independently represent a hydrogen atom, a halogen atom or an alkyl group having 1 to 3 carbon atoms; and L represents a linkage with a conjugated bond having 5 to 13 carbon atoms.

2. The image forming method of claim 1, wherein the acid generating compound does not have an absorption band in the wavelength region of 400 nm or more.

3. The image forming method of claim 2, wherein the acid generating compound is at least one selected from an organic halogen containing compound and a diphenyl iodonium salt.

4. The image forming method of claim 3, wherein the organic halogen containing compound is an s-triazine compound.

5. The image forming method of claim 1, wherein an absorption maximum wavelength λmax of the acid generating compound is in the range of from 200 to 360 nm.

6. The image forming method of claim 1, wherein the radiation sensitive layer further contains a resin which is insoluble in water and is soluble in an alkali.

7. The image forming method of claim 1, wherein the acid decomposable compound is an acetal or a silyl ether.

8. The image forming method of claim 1, wherein the acid decomposable compound is decomposed by an acid to produce an aldehyde, a ketone or a silyl compound each having a solubility in 25° C. water of 1 to 100 g/liter.

9. The image forming method of claim 1, wherein the developer contains a silicate.

10. The image forming method of claim 9, wherein the content ratio by mole of the silicate to an alkali metal in the developer is in the range of from 0.15 to 1.0.

11. The image forming method of claim 1, wherein the developer further contains an organic solvent having a solubility in 25° C. water of 10 weight % or less.

12. The image forming method of claim 1, wherein the developing is continuously carried out while the developer is replenished with a developer replenisher.

13. The image forming method of claim 1 wherein at least 500 $m^2$ of exposed or heated image forming materials is continuously developed with the developer.

14. The image forming method of claim 13, wherein 1000 $m^2$ or more of exposed image forming materials are continuously developed.

15. The image forming method of claim 13, wherein 3000 $m^2$ or more of exposed image forming materials are continuously developed.

16. The image forming method of claim 13 wherein the developer is replenished with a developer replenisher and the replenishing amount of the developer replenisher is 5 to 100 ml per $m^2$ of image forming material to be processed.

17. The image forming method of claim 16, wherein the developer is replenished with the developer replenisher in an amount of 5 to 50 ml per $m^2$ of image forming material to be processed.

18. The image forming method of claim 16, wherein the developer is replenished with the developer replenisher in an amount of 5 to 25 ml per $m^2$ of image forming material to be processed.

19. The image forming method of claim 1 wherein $R_3$ and $R_4$ independently represent an alkyl group having 1 to 5 carbon atoms, an alkoxy group having 1 to 5 carbon atoms, or $-((CH_2)_n-O-)_k-(CH_2)_mOR$, in which each of n and m independently is an integer of 1 to 3, k is 0 or 1, and R is an alkyl group having 1 to 5 carbon atoms; or one of $R_3$ or $R_4$ is $-RSO_3M$, and the other is $-RSO_3^-$, wherein R represents an alkylene group having 1 to 5 carbon atoms, and M represents an alkali metal atom; or one of $R_3$ and $R_4$ is $-RCOOM$, and the other is $-RCOO^-$, wherein R represents an alkylene group having 1 to 5 carbon atoms, and M represents an alkali metal atom.

20. An image forming material comprising a support, and a radiation sensitive layer containing a dye having an absorption band in a wavelength region of from 700 nm to 1200 nm, an acid generating compound capable of generating an acid on irradiation of heat or actinic light, and an acid decomposable compound having a bond capable of being decomposed by an acid, wherein the acid decomposable compound is decomposed by an acid to produce a diol compound containing an ethylene glycol component or a propylene glycol component, and wherein the dye is a cyanine dye represented by formula (2) or (3):

formula (2)

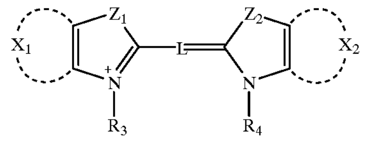

formula (3)

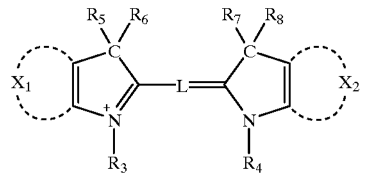

wherein $Z_1$ and $Z_2$ independently represent a sulfur atom, a selenium atom or an oxygen atom; $X_1$ and $X_2$ independently represent a non-metallic atomic group necessary to form a benzene or naphthalene ring, which may have a substituent; $R_3$ and $R_4$ independently represent a substituent; $R_5$, $R_6$, $R_7$ and $R_8$ independently represent a hydrogen atom, a halogen atom or an alkyl group having 1 to 3 carbon atoms; and L represents a linkage with a conjugated bond having 5 to 13 carbon atoms.

21. The image forming material of claim 20 wherein $R_3$ and $R_4$ independently represent an alkyl group having 1 to 5 carbon atoms, an alkoxy group having 1 to 5 carbon atoms, or $-((CH_2)_n-O-)_k-(CH_2)_mOR$, in which each of n and m independently is an integer of 1 to 3, k is 0 or 1, and R is an alkyl group having 1 to 5 carbon atoms; or one of $R_3$ and $R_4$ is $-RSO_3M$, and the other is $-RSO_3^-$, in which R represents an alkylene group having 1 to 5 carbon atoms, and M represents an alkali metal atom; or one of $R_3$ and $R_4$ is $-RCOOM$, and the other is $-RCOO^-$, in which R is an alkylene group having 1 to 5 carbon atoms, and M is an alkali metal atom.

* * * * *